US012796013B2

(12) United States Patent
Pfaffenlehner et al.

(10) Patent No.: US 12,796,013 B2
(45) Date of Patent: Nov. 10, 2026

(54) POWER SEMICONDUCTOR DEVICE HAVING A LATERALLY INHOMOGENEOUS SPATIAL LOAD CURRENT DENSITY AND METHOD FOR FORMING THE SAME

(71) Applicant: Infineon Technologies AG, Neubiberg (DE)

(72) Inventors: Manfred Pfaffenlehner, Munich (DE); Josef-Georg Bauer, Markt Indersdorf (DE); Frank Dieter Pfirsch, Munich (DE); Thilo Scheiper, Dortmund (DE); Konrad Schraml, Feldkirchen (DE)

(73) Assignee: Infineon Technologies AG, Neubiberg (DE)

( * ) Notice: Subject to any disclaimer, the term of this patent is extended or adjusted under 35 U.S.C. 154(b) by 850 days.

(21) Appl. No.: 16/868,314

(22) Filed: May 6, 2020

(65) Prior Publication Data

US 2020/0357883 A1 Nov. 12, 2020

(30) Foreign Application Priority Data

May 7, 2019 (DE) ......................... 102019111786.0

(51) Int. Cl.
*H10D 62/10* (2025.01)
*H10D 30/60* (2025.01)
(Continued)

(52) U.S. Cl.
CPC ........ *H10D 62/107* (2025.01); *H10W 10/031* (2026.01); *H10W 10/30* (2026.01)

(58) Field of Classification Search
CPC ... H01L 21/761; H01L 29/0623; H10D 30/60; H10D 62/107
See application file for complete search history.

(56) References Cited

U.S. PATENT DOCUMENTS

| | | | | |
|---|---|---|---|---|
| 2006/0197159 A1 | | 9/2006 | Schmidt | |
| 2007/0246791 A1 | * | 10/2007 | Schulze | H10D 62/105 257/E29.066 |

(Continued)

FOREIGN PATENT DOCUMENTS

| | | |
|---|---|---|
| CN | 104241398 A | 12/2014 |
| DE | 102010016371 A1 | 11/2010 |
| DE | 102014209935 A1 | 12/2014 |

*Primary Examiner* — Anh D Mai
(74) *Attorney, Agent, or Firm* — Murphy, Bilak & Homiller, PLLC

(57) ABSTRACT

A power semiconductor device includes an active region having a total volume with a central volume forming at least 20% of the total volume, a peripheral volume forming at least 20% of the total volume and surrounding the central volume, and an outermost peripheral volume forming at least 5% of the total volume and surrounding the peripheral volume. The peripheral volume has a constant lateral distance from an edge termination region. A first doped semiconductor region is electrically connected with a first load terminal at a semiconductor body frontside. A second doped semiconductor region is electrically connected with a second load terminal at a semiconductor body backside. The first and/or second doped semiconductor region has: a central portion extending into the central volume and having a central average dopant dose; and a peripheral portion extending into the peripheral volume and having a peripheral average dopant dose.

8 Claims, 10 Drawing Sheets

(51) Int. Cl.
*H10W 10/00* (2026.01)
*H10W 10/30* (2026.01)

(56) References Cited

U.S. PATENT DOCUMENTS

| | | | | |
|---|---|---|---|---|
| 2013/0153954 | A1* | 6/2013 | Takahashi ........... | H01L 29/0696 257/E29.197 |
| 2015/0171199 | A1 | 6/2015 | Senoo | |
| 2016/0315169 | A1* | 10/2016 | Yoshikawa ......... | H01L 29/0619 |
| 2017/0294526 | A1 | 10/2017 | Storasta et al. | |

* cited by examiner

POWER SEMICONDUCTOR DEVICE HAVING A LATERALLY INHOMOGENEOUS SPATIAL LOAD CURRENT DENSITY AND METHOD FOR FORMING THE SAME

TECHNICAL FIELD

This specification refers to embodiments of a power semiconductor device and to embodiments of a method of processing a power semiconductor device. In particular, this specification refers to aspects of a frontside emitter and/or a backside emitter that is/are structured in a peripheral volume adjacent to an edge termination region of the power semiconductor device.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

Irrespective of whether the power semiconductor device is implemented as a non-controllable device, e.g., a non-controllable diode, or as a controllable device, e.g., a transistor a thyristor or the like, it is usually desirable to provide a reliable device that exhibits low risk of malfunction, e.g., due to overheating and/or so-called dynamic avalanche.

To this end, it can be desirable to adjust a spatial distribution of the load current density in the semiconductor body.

SUMMARY

Aspects described herein relate to a frontside and/or a backside emitter in a peripheral volume adjacent to an edge termination region of a power semiconductor device. Implementing the emitter(s) may involve structuring the emitter(s) with respect to its/their lateral and/or vertical average dopant dose profile, wherein such profile(s) may be designed so as to achieve a designated load current density distribution in the power semiconductor body.

According to an embodiment, a power semiconductor device comprises an active region with at least one power cell, wherein the active region has a total volume, the total volume having a central volume forming at least 20% of the total volume; a peripheral volume forming at least 20% of the total volume and surrounding the central volume; and an outermost peripheral volume forming at least 5% of the total volume and surrounding the peripheral volume. The power semiconductor device further comprises an edge termination region surrounding the outermost peripheral volume of the active region, wherein the peripheral volume has a constant lateral distance from the edge termination region; a semiconductor body having a frontside and a backside, wherein the semiconductor body forms both a part of the active region and a part of the edge termination region; a first load terminal at the semiconductor body frontside and a second load terminal at the semiconductor body backside; a first doped semiconductor region formed in the semiconductor body and electrically connected with the first load terminal; a second doped semiconductor region formed in the semiconductor body and electrically connected with the second load terminal. At least one of the first doped semiconductor region and the second doped semiconductor region has a central portion extending into the central volume of the active region and having a central average dopant dose; a peripheral portion extending into the peripheral volume of the active region and having a peripheral average dopant dose, wherein the central average dopant dose is lower than the peripheral average dopant dose by at least 5%, or by at least 10%.

According to an embodiment, a power semiconductor device comprises an active region with at least one power cell, wherein the active region has a total volume, the total volume having a central volume forming at least 80% of the total volume; a peripheral volume surrounding the central volume; and an edge termination region arranged external of the active region and surrounding the peripheral volume; a semiconductor body having a frontside and a backside, wherein the semiconductor body forms a part of each of the active region, the peripheral volume and the edge termination region. The semiconductor body has a total thickness along a vertical direction between the frontside and the backside. The peripheral volume has a lateral extension amounting to at least half of the total semiconductor body thickness. The power semiconductor device further comprises a first load terminal at the semiconductor body frontside and a second load terminal at the semiconductor body backside; a first doped semiconductor region formed in the semiconductor body and electrically connected with the first load terminal; a second doped semiconductor region formed in the semiconductor body and electrically connected with the second load terminal. The second doped semiconductor region has a central portion extending into the central volume of the active region and having a central average dopant dose; a peripheral portion extending into the peripheral volume and having a peripheral average dopant dose with, along the lateral extension of the peripheral volume, a negative gradient in a lateral direction towards the edge termination region; and an edge portion extending into the edge termination region and having an edge average dopant dose, wherein the edge average dopant dose is lower than the central average dopant dose, e.g., by at least 5%.

According to an embodiment, a power semiconductor device comprises an active region with at least one power cell, wherein the active region has a total volume, the total volume having a central volume forming at least 20% of the total volume; a peripheral volume forming at least 20% of the total volume and surrounding the central volume; and an outermost peripheral volume forming at least 5% of the total volume and surrounding the peripheral volume. The power semiconductor device further comprises an edge termination region surrounding the outermost peripheral volume of the active region, wherein the peripheral volume has a constant lateral distance from the edge termination region; a semiconductor body having a frontside and a backside, wherein the semiconductor body forms both a part of the active region and a part of the edge termination region; a first load terminal at the semiconductor body frontside and a second load terminal at the semiconductor body backside. The active region is configured to conduct a load current between the first load terminal and the second load terminal, wherein a load current density in the central volume is lower than a load current density in the peripheral volume by at least 5%.

According to an embodiment a method of processing a power semiconductor device comprises providing a power semiconductor device having an active region with at least one power cell, wherein the active region has a total volume, the total volume having a central volume forming at least 20% of the total volume; a peripheral volume forming at least 20% of the total volume and surrounding the central volume; and an outermost peripheral volume forming at least 5% of the total volume and surrounding the peripheral volume. The power semiconductor device further comprises an edge termination region surrounding the outermost peripheral volume of the active region, wherein the peripheral volume has a constant lateral distance from the edge termination region; a semiconductor body having a frontside and a backside, wherein the semiconductor body forms both a part of the active region and a part of the edge termination region; a first load terminal at the semiconductor body frontside and a second load terminal at the semiconductor body backside. The method further comprises forming a first doped semiconductor region in the semiconductor body such that it is electrically connected with the first load terminal; forming a second doped semiconductor region in the semiconductor body such that it is electrically connected with the second load terminal. At least one of the first doped semiconductor region and the second doped semiconductor region has a central portion extending into the central volume of the active region and having a central average dopant dose; a peripheral portion extending into the peripheral volume of the active region and having a peripheral average dopant dose, wherein the central average dopant dose is lower than the peripheral average dopant dose by at least 5%, or by at least 10%.

According to an embodiment, a method of processing a power semiconductor device comprises providing a power semiconductor device having an active region with at least one power cell, wherein the active region has a total volume, the total volume having a central volume forming at least 80% of the total volume; a peripheral volume surrounding the central volume; and an edge termination region arranged external of the active region and surrounding the peripheral volume; a semiconductor body having a frontside and a backside, wherein the semiconductor body forms a part of each of the active region, the peripheral volume and the edge termination region. The semiconductor body has a total thickness along a vertical direction between the frontside and the backside. The peripheral volume has a lateral extension amounting to at least half of the total semiconductor body thickness. The power semiconductor device further comprises a first load terminal at the semiconductor body frontside and a second load terminal at the semiconductor body backside. The method further comprises forming a first doped semiconductor region in the semiconductor body such that it is electrically connected with the first load terminal; and forming a second doped semiconductor region in the semiconductor body such that it is electrically connected with the second load terminal. The second doped semiconductor region has a central portion extending into the central volume of the active region and having a central average dopant dose; a peripheral portion extending into the peripheral volume and having a peripheral average dopant dose with, along the lateral extension of the peripheral volume, a negative gradient in a lateral direction towards the edge termination region; and an edge portion extending into the edge termination region and having an edge average dopant dose, wherein the edge average dopant dose is lower than the central average dopant dose, e.g., by at least 5%.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIGS. 2A-20 each schematically and exemplarily illustrate a section of a horizontal projection of a power semiconductor device in accordance with one or more embodiments;

FIG. 3 schematically and exemplarily illustrates a section of a vertical cross-section of an active region of a power semiconductor device in accordance with one or more embodiments;

FIG. 7 schematically and exemplarily illustrates a section of a vertical cross-section of a reference diode;

FIG. 9 schematically and exemplarily illustrates a section of a vertical cross-section of a reference diode;

FIGS. 10A, 10B, 11-13 schematically and exemplarily illustrate various vertical cross-sections of a power semiconductor device having a second doped semiconductor region with a decreased average dopant dose in a peripheral volume in accordance with some embodiments;

FIG. 14 schematically and exemplarily illustrate courses of a lateral dopant dose profile in accordance with some embodiments; and FIG. 15 schematically and exemplarily illustrates an implantation pattern in accordance with some embodiments.

DETAILED DESCRIPTION

Figure 1:
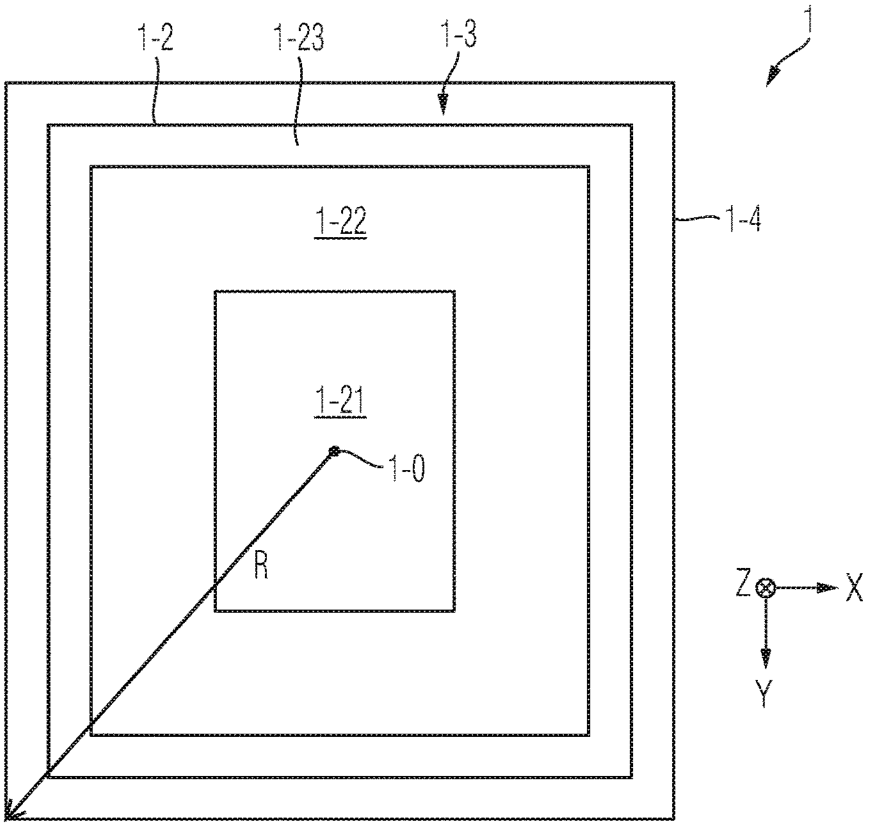
FIG. 1 schematically and exemplarily illustrates a section of a horizontal projection of a power semiconductor device in accordance with one or more embodiments.

In the following detailed description, reference is made to the accompanying drawings which form a part hereof and in which are shown by way of illustration specific embodiments in which the invention may be practiced.

In this regard, directional terminology, such as “top”, “bottom”, “below”, “front”, “behind”, “back”, “leading”, "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other. Also the radial direction R mentioned below can be a lateral, i.e., horizontal direction, e.g., formed by an arbitrary, e.g., linear, combination of the first lateral direction X and the second lateral direction Y.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device exhibiting a single cell, a stripe cell, a cellular (also referred to as "needle" or "columnar") cell or another cell configuration, e.g., a power semiconductor device that may be used within a power converter or a power supply. Thus, in an embodiment, the power semiconductor device described herein can be configured to carry a load current that is to be fed to a load and/or, respectively, that is provided by a power source.

For example, the power semiconductor device may comprise one or more active power semiconductor cells, such as a monolithically integrated diode cell, a derivative of a monolithically integrated diode cell (e.g., a monolithically integrated cell of two anti-serially connected diodes), a monolithically integrated transistor cell, e.g., a monolithically integrated IGBT cell, a monolithically integrated RC IGBT cell, a monolithically integrated MOSFET cell, a monolithically integrated thyristor cell, a monolithically integrated Gate turn-off thyristor (GTO) cell and/or derivatives thereof. Such diode/transistor cells may be integrated in a power semiconductor module. A plurality of such equally configured cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, the power semiconductor device described herein can be a single-chip power semiconductor device and can be intended for high currents, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more.

For example, the power semiconductor device described herein may be a single semiconductor chip exhibiting a single cell configuration, a stripe cell configuration or a cellular cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor-based data processing.

FIG. 1 schematically and exemplarily illustrates a section of a horizontal projection of a power semiconductor device 1 in accordance with one or more embodiments. The power semiconductor device 1 can be based on/implemented within a single chip. The power semiconductor device 1 can for example be one of a diode, an IGBT or a MOSFET or a derivative of a diode, an IGBT, or a MOSFET.

Figure 2A:
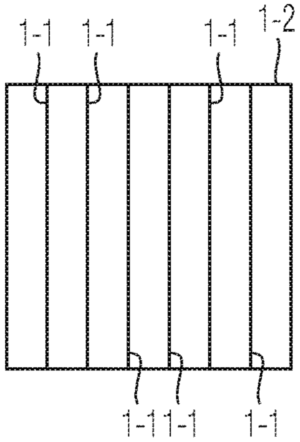
Figure 2A:
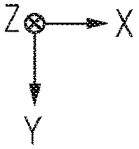
Figure 2B:
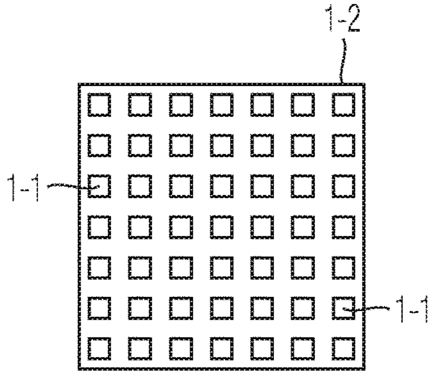
Figure 2C:
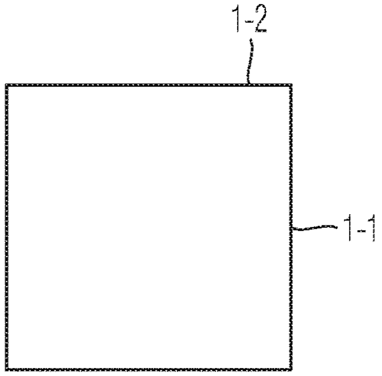

The power semiconductor device 1 has an active region 1-2 with at least one power cell 1-1 (cf. FIGS. 2A-C). The active region 1-2 has a total volume, wherein the total volume has a central volume 1-21 forming at least 20% of the total volume.

The central volume 1-21 can for example form up to 75% of the volume. For example, the central volume 1-21 may form 20% to 75% (but, e.g., no more than 75%) of the total volume.

The power semiconductor device 1 has a peripheral volume 1-22 surrounding the central volume 1-21.

In some embodiments, e.g., if the power semiconductor device 1 is a diode, the peripheral volume 1-22 may be entirely comprised in the active region 1-2 and, e.g., form at least 20% of the total volume of the active region 1-2. For example, the peripheral volume 1-22 may form up to 50% of the total volume of the active region 1-2.

In another embodiment, e.g., if the power semiconductor device 1 is an IGBT, the peripheral volume 1-22 may extend into both an edge termination region 1-3 and the active region 1-2, or only into the active region 1-2 or only into the edge termination region 1-3.

In some embodiments, e.g., if the power semiconductor device 1 is a diode, the active region 1-2 may further comprise an optional outermost peripheral volume 1-23 forming at least 5% of the total volume and surrounding the peripheral volume 1-22. For example, in these embodiments, the active region 1-2 consists of the three volumes: the central volume 1-21 (e.g., forming 50% of the total volume), the peripheral volume 1-22 (e.g. forming 45% of the total volume) and the outermost peripheral volume 1-23 (e.g., forming 5% of the total volume).

The edge termination region 1-3 of the power semiconductor device 1 surrounds the peripheral volume 1-22 or, respectively, if present, the outermost peripheral volume 1-23. Hence, the edge termination region 1-3 is arranged external of the active region 1-2. The edge termination region 1-3 is laterally terminated by an edge 1-4. The edge 1-4 may form the chip edge of the power semiconductor device 1.

The central volume 1-21 may directly adjoin to the peripheral volume 1-22, and the peripheral volume 1-22 may directly adjoin to the outermost peripheral volume 1-23 (if present) or, respectively, the edge termination region 1-3.

As used herein, the terms “edge termination region” and “active region” are both associated with the technical meaning the skilled person typically associates therewith in the context of power semiconductor devices. That is, the active region 1-2 is primarily configured for load current conduction and switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

For example, the boundary of the active region 1-2 is defined by the lateral boundary of the outermost power cell(s) 1-1. For example, in case of a diode, this lateral boundary can be identical to the lateral boundary of the first load terminal 11 (cf. explanation in more detail below). In case of a multi-cell IGBT, this lateral boundary can be defined by an outermost source region(s) 109 (cf. explanation in more detail below). For example, all functional elements to enable conduction of the load current are present in a vertical projection of the active region 1-2 of the power semiconductor device 1, e.g., including at least the first load terminal (e.g., a frontside metal contact thereof), an anode/body region, a drift region, a backside emitter, and the second load terminal 12 (e.g., a backside metal thereof).

As will be explained in more detail below, the structure of the central volume 1-21 of the active region 1-2 may differ from the structure of the peripheral volume 1-22 and, if present, the structure of the outermost peripheral volume 1-23.

In an embodiment, the central volume 1-21 and the peripheral volume 1-22 (and, if present, the outermost peripheral volume 1-23) are symmetrically arranged to one another, e.g., with respect to a central vertical axis 1-0 of the power semiconductor device 1. Furthermore, the edge termination region 1-3 and the active region 1-2 may be symmetrically arranged to one another, e.g., with respect to the central vertical axis 1-0 of the power semiconductor device 1, as it is exemplarily illustrated in FIG. 1.

Furthermore, the lateral transition between the central volume 1-21 and the peripheral volume 1-22 may extend exclusively along the vertical direction Z. Also, the lateral transition between the active region 1-2 and the edge termination region 1-3 may extend exclusively along the vertical direction Z, in accordance with an embodiment. Furthermore, if present, the lateral transitions between the peripheral volume 1-22 and the outermost peripheral volume 1-23 may extend exclusively along the vertical direction Z.

For example, the peripheral volume 1-22 (when forming exclusively a part of the active region 1-2) can have a constant lateral distance from the edge termination region 1-3. In an embodiment, said constant lateral distance from the edge termination region 1-3 is filled with or, respectively, formed by the outermost peripheral volume 1-23, as illustrated in FIG. 1.

With reference to FIGS. 2A-C, it shall be understood that the cell configuration of the active region 1-2 may be arbitrarily chosen. In one embodiment (FIG. 2A), the active region 1-2 has a plurality of power cells 1-1 configured as stripe cells arranged adjacent to each other, e.g., along the first lateral direction X. Such configuration can for example be applied for forming an IGBT, e.g., an IGBT having a micro-pattern-trench (MPT) configuration. In another embodiment (FIG. 2B), the active region 1-2 has a plurality of power cells 1-1 configured as columnar/needle cells arranged adjacent to each other in accordance with a grid pattern, for example. Such configuration can for example be applied for forming a MOSFET. In yet another embodiment (FIG. 2C), the active region 1-2 has only one power cell 1-1. Such configuration can for example be applied for forming a diode.

Figure 3:
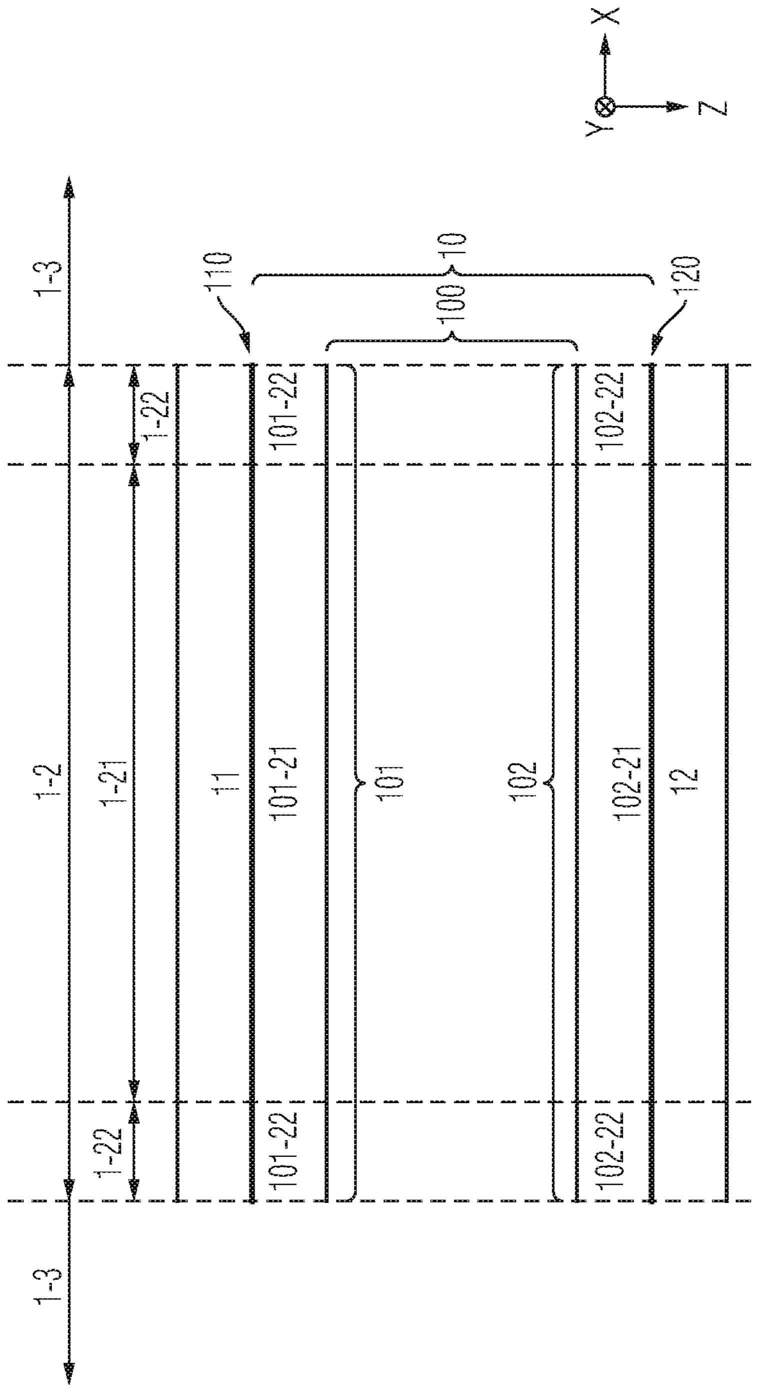

FIG. 3 schematically and exemplarily illustrates a section of a vertical cross-section of the active region 1-2 of the power semiconductor device 1 in accordance with one or more embodiments. The foregoing description referring to FIG. 1 and one of FIGS. 2A-C may equally apply to the embodiment illustrated in FIG. 3.

The power semiconductor device 1 has a semiconductor body 10 having a frontside 110 and a backside 120. The frontside 110 and the backside 120 may vertically terminate the semiconductor body 10. That is, the semiconductor body 10 has a total thickness along the vertical direction Z between the frontside 110 and the backside 120. In the lateral directions, the semiconductor body 10 may be terminated by the edge 1-4 (not illustrated in FIG. 3).

Here, it shall be noted that the peripheral volume 1-22 can have a lateral extension amounting to at least half of the total semiconductor body thickness, or to even more than the total semiconductor body thickness. Furthermore, in contrast to the schematic illustration in FIG. 3, it shall again be emphasized that in some embodiments, the peripheral volume 1-22 is not entirely comprised in the active region 1-2, but may also or exclusively extend into the edge termination region 1-3. In other embodiments, the peripheral volume 1-22 is entirely comprised in the active region 1-2 (as illustrated in FIG. 3), and the active region 1-2 may furthermore comprise the outermost peripheral region 1-23 (as not illustrated in FIG. 3).

The semiconductor body 10 forms a part of each of the active region 1-2, the peripheral volume 1-22 and the edge termination region 1-3. The semiconductor body 10 is, in the active region 1-2 configured to conduct a load current between a first load terminal 11 and a second load terminal 12. For example, the above described cell configuration of the power cell(s) is primarily implemented in the semiconductor body 10. The first load terminal 11 is arranged at the semiconductor body frontside 110 and the second load terminal 12 is arranged at the semiconductor body backside 120. For example, the first load terminal 11 comprises a frontside metallization and/or the second load terminal 12 comprises a backside metallization.

For example, the power semiconductor device 1 can have an IGBT configuration. Then, the first load terminal 11 can be an emitter terminal and the second load terminal 12 can be a collector terminal. In another embodiment, the power semiconductor device 1 has a MOSFET configuration. Then, the first load terminal 11 can be a source terminal and the second load terminal 12 can be a drain terminal. In yet another embodiment, the power semiconductor device 1 has a diode configuration. Then, the first load terminal 11 can be an anode terminal and the second load terminal 12 can be a cathode terminal.

In an embodiment, the first load terminal 11 (e.g., said frontside metallization) laterally overlaps, that is, along the first lateral direction X and/or the second lateral direction Y and/or combinations thereof (cf. radial direction R in FIG. 1), with the active region 1-2. In an embodiment, the first load terminal 11 may form both a part of the central volume 1-21 of the active region 1-2 and a part of peripheral volume 1-22, e.g., if the peripheral volume 1-22 is at least partially comprised in the active region 1-2. For example, the first load terminal 11 (e.g., said frontside metallization) laterally overlaps with the peripheral volume 1-22 for at least 80% or with even 100% of the total lateral extension of the peripheral volume 1-22. For example, as illustrated in FIG. 3, the first load terminal 11 (e.g., said frontside metallization) laterally overlaps entirely with the peripheral volume 1-22 of the active region 1-2. It shall be noted that the first load terminal 11 may be laterally structured, e.g., so as to establish local contacts with the semiconductor body 10. Such lateral structure may also be implemented in regions where the first load terminal 11 laterally overlaps with the peripheral volume 1-22.

At this point, it shall again be made clear that the peripheral volume 1-22 may, in other embodiments, not or only partially included in the active region 1-2. For example, if the peripheral volume 1-22 does not extend into the active region 1-2 but only in the edge termination region 1-3, there may also be no overlap between the first load terminal 11 and the peripheral volume 1-22.

Analogously, in an embodiment, the second load terminal 12 (e.g., said backside metallization) laterally overlaps, that is, along the first lateral direction X and/or the second lateral direction Y and/or combinations thereof (cf. radial direction R in FIG. 1), with the active region 1-2. In an embodiment, the second load terminal 12 may form both a part of the central volume 1-21 of the active region 1-2 and a part of peripheral volume 1-22. E.g., the second load terminal 12 (e.g., said backside metallization) laterally overlaps with the peripheral volume 1-22 for at least 80% or with even 100% of the total lateral extension of the peripheral volume 1-22. For example, as illustrated in FIG. 3, the second load terminal 12 (e.g., said backside metallization) laterally overlaps entirely with the peripheral volume 1-22. It shall be noted that the second load terminal 12 is typically not structured but formed homogenously and monolithically at the semiconductor backside 120, e.g., so as to establish a laterally homogenous contact with the semiconductor body 10. Such homogenous structure may also be implemented in regions where the second load terminal 12 laterally overlaps with the peripheral volume 1-22.

Still referring to FIG. 3, it shall be understood that in some embodiments, the total volume of the active region 1-2 may be terminated, as explained above, by the outermost peripheral volume 1-23, which is not illustrated in FIG. 3.

The power semiconductor device 1 further includes a first doped semiconductor region 101 formed in the semiconductor body 10 and electrically connected with the first load terminal 11, and a second doped semiconductor region 102 formed in the semiconductor body 10 and electrically connected with the second load terminal 12. For example, the first doped semiconductor region 101 is separated from the second doped semiconductor region 102 along the vertical direction Z at least by means of a semiconductor drift region 100.

The total extension of the drift region 100 in the vertical direction Z may be at least four times (or even at least ten times) larger than a maximal extension of the first doped semiconductor region 101 in the vertical direction Z, and/or be at least four times (or even at least ten times) larger than a maximal extension of the second doped semiconductor region 102 in the vertical direction Z.

For example, the first doped semiconductor region 101 forms a frontside emitter region of the power semiconductor device 1.

Further, the second doped semiconductor region 102 can form a backside emitter region of the power semiconductor device 1.

In an embodiment, the first doped semiconductor region 101 extends contiguously into both the peripheral volume 1-22 and the central volume 1-21. Additionally or alternatively, the second doped semiconductor region 102 may extend contiguously into both the peripheral volume 1-22 and the central volume 1-21.

In accordance with one or more embodiments, in a vertical cross-section, the first load terminal 11 and the first doped semiconductor region 101 may laterally overlap with each other, and/or a transition between the first load terminal 11 and the first doped semiconductor region 101 along the vertical direction Z is electrically conductive along at least 75% of the total lateral extension of the peripheral volume 1-22. Additionally or alternatively, in said vertical cross-section, the second load terminal 12 and the second doped semiconductor region 102 may laterally overlap with each other, and/or a transition between the second load terminal 12 and the second doped semiconductor region 102 along the vertical direction Z is electrically conductive along at least 75% of the total lateral extension of the peripheral volume 1-22.

Both the first doped semiconductor region 101 and the second doped semiconductor region 102 can be configured to contribute in forming a path for the power semiconductor device load current. For example, during a conducting state of the power semiconductor device 1, where a load current is conducted between the first load terminal 11 and the second load terminal 12, both the first doped semiconductor region 101 and the second doped semiconductor region 102 contribute in maintaining a high charge carrier concentration in the semiconductor body 10 that yields low conduction losses.

For example, the power semiconductor device 1 can have an IGBT configuration. Then, the first doped semiconductor region 101 can be a body region of e.g., the second conductivity type, e.g., a "p-emitter", (or a source region of e.g., the first conductivity type, e.g., an "n-emitter"), and the second doped semiconductor region 102 can be a collector region of, e.g., the second conductivity type, e.g., a "p-emitter".

In another embodiment, the power semiconductor device 1 has a MOSFET configuration. Then, the first doped semiconductor region 101 can be a body region of e.g., the second conductivity type, e.g., a "p-emitter", (or a source region of e.g., the first conductivity type, e.g., an "n-emitter") and the second doped semiconductor region 102 can be a drain region of, e.g., the first conductivity type, e.g., a further "n-emitter".

In yet another embodiment, the power semiconductor device 1 has a diode configuration. Then, the first doped semiconductor region 101 can be an anode region of, e.g., the second conductivity type, e.g., a "p-emitter", and the second doped semiconductor region 102 can be a cathode region, of e.g., the first conductivity type, e.g., an "n-emitter". Also, combinations thereof are possible, e.g., so as to design the semiconductor device with an RC-IGBT configuration.

Still referring to FIG. 3, in accordance with an embodiment, at least one of the first doped semiconductor region 101 and the second doped semiconductor region 102 has (i.e., either the first or the second doped semiconductor region or both the first and the second doped semiconductor region):

- a central portion 101-21; 102-21 extending into the central volume 1-21 of the active region 1-2 and having a central average dopant and a peripheral portion 101-22; and
- a peripheral portion 101-22; 102-22 extending into the peripheral volume 1-22 and having a peripheral average dopant dose.

For example, the central portion 101-21 of the first doped semiconductor region 101 has the same total lateral extensions as the central volume 1-21 of the active region 1-2. Further, also the central portion 102-21 of the second doped semiconductor region 102 can have the same total lateral extensions as the central volume 1-21 of the active region 1-2. Hence, it shall be understood that in accordance with embodiments described herein, the central portion 101-21/102-21 (of the first doped semiconductor region 101 and/or the second doped semiconductor region 102) extends into the central volume 1-21 of the active region 1-2 along the vertical direction Z. For example, the central portion 101-21/102-21 does not extend laterally beyond the boundaries of the central volume 1-21.

Correspondingly, the peripheral portion 101-22 of the first doped semiconductor region 101 can have the same total lateral extensions as the peripheral volume 1-22. The peripheral portion 102-22 of the second doped semiconductor region 102 can also have the same total lateral extensions as the peripheral volume 1-22.

The preceding paragraph shall make clear that, in accordance with some or all embodiments described herein, the first doped semiconductor region 101 may contiguously extend into the entire active region 1-2, e.g., may contiguously extend along the entire lateral extensions of the both the central volume 1-21 (there forming its central portion 101-21) and the peripheral volume 1-22 (there forming its peripheral portion 101-22). This also applies to the second doped semiconductor region 102, which may, in accordance with some or all embodiments described herein, contiguously extend into the entire active region 1-2, e.g., may contiguously extend along the entire lateral extensions of the both the central volume 1-21 (there forming its central portion 102-21) and the peripheral volume 1-22 (there forming its peripheral portion 102-22).

In embodiments described herein, the central average dopant dose may differ from the peripheral average dopant dose by at least 5%, by at least 10%, by at least 20% or by even more than 50%.

Specifically, in embodiments where the active region 1-2 comprises the entire peripheral volume 1-22 and the outermost peripheral volume 1-23 (e.g., when the power semiconductor device 1 is a diode), and where the peripheral volume 1-22 forms at least 20% of the total volume of the active region 1-2, and where the outermost peripheral volume 1-23 forms at least 5% of the total volume of the active region 1-2, the central average dopant dose can be lower than the peripheral average dopant dose by at least 5%, by at least 10%, by at least 30% or by even by at least 50%.

Figure 8A:
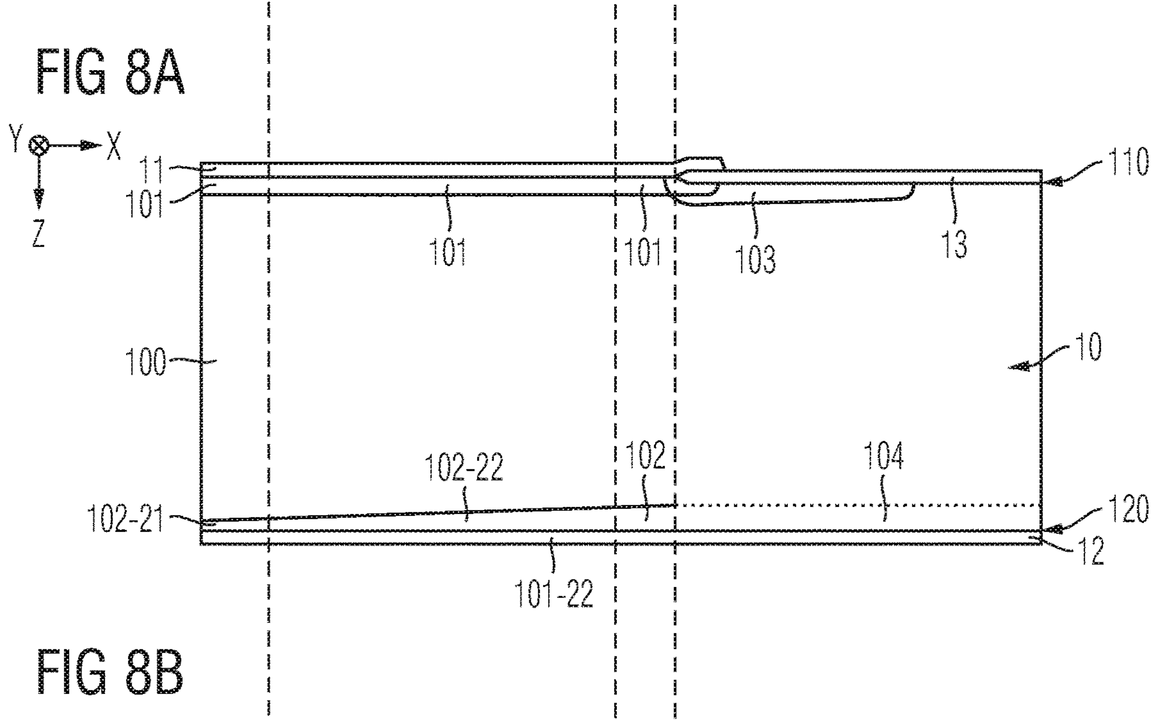
FIGS. 8A-8B schematically and exemplarily illustrate various vertical cross-sections of a power semiconductor device having a second doped semiconductor region with an increased average dopant dose in a peripheral volume in accordance with some embodiments.
Figure 8B:
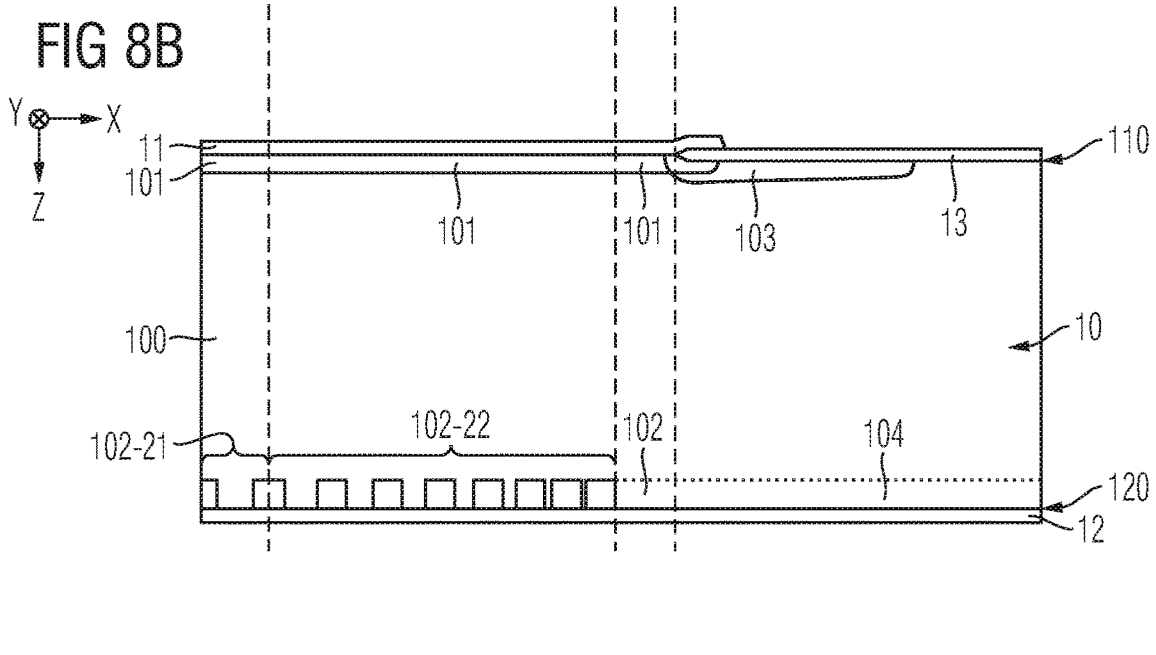

As explained above, in an embodiment, the central portion 101-21 of the first doped semiconductor region 101 is not separated (not spaced apart) from its peripheral portion 101-22. Also, in an embodiment, the central portion 102-21 of the second doped semiconductor region 102 is not separated (not spaced apart) from its peripheral portion 102-22. Rather, the two portions may form a respective contiguous semiconductor region 101; 102. This may also apply analogously if, e.g., the second semiconductor region 102 laterally structured, e.g., formed by means of a plurality of local emitters (as illustrated in FIG. 8B). However, it shall be understood that, in accordance with an embodiment, both the central portion 101-21 and the peripheral portion 101-22 of the first doped semiconductor region 101 are electrically connected to the first load terminal 11, and that, in accordance with an embodiment, both the central portion 102-21 and the peripheral portion 102-22 of the second doped semiconductor region 102 are electrically connected to the second load terminal 12.

In accordance with one or more embodiments, an appropriately chosen difference in average dopant doses allows for designing the power semiconductor device 1 with a defined distribution of the spatial load current density and, hence, also with a correspondingly defined spatial temperature distribution. For example, by increasing the average dopant dose in the peripheral volume(s) 101-22; 102-22 it is possible to guide a greater portion of the load current within the peripheral volume 1-22, thereby reducing the risk of creating too hot regions within the central volume 1-21.

For example, in an embodiment (and independent from the eventual difference in said average dopant doses), the active region 1-2 is configured to conduct the load current between the first load terminal 11 and the second load terminal 12, wherein a load current density in the central volume 1-21 is lower than a load current density in the peripheral volume 1-22 by at least 5%, by at least 10% or by at least 15%. In addition to or in alternative to the above described difference in said average dopant doses, this may be achieved by correspondingly structuring the first load terminal 11 and/or the second load terminal 12. For example, by means of a load terminal structure, it is possible to laterally structure the resistance between the semiconductor body 10 and the load terminal(s). For example, for increasing the load current density in the peripheral volume 1-22, the transition between the first load terminal 11 and the semiconductor body 10 in the peripheral volume 1-22 has a decreased resistance and/or the transition between the first load terminal 11 and the semiconductor body 10 in the central volume 1-21 has an increased resistance.

Herein, the respective dopant dose of the first and the second doped semiconductor region 101, 102 can be defined by the dopant concentration integrated along the vertical direction Z, which, e.g., points from the first load terminal 11 to the second load terminal 12. For example, the respective average dopant dose is defined by the dopant dose averaged along a distance of at least 10 μm in at least one of the lateral directions R; X; Y perpendicular to the vertical direction Z and pointing from the central volume 1-21 to the edge termination region 1-3. The respective average dopant dose can even be defined by the dopant dose averaged along the total lateral extension of the respective region, or, respectively, volume, in the lateral direction R; X; Y. Of course, for comparison purposes, the average dopant dose in the peripheral portion 101-22; 102-22 is determined at the same vertical level and along the same lateral direction as in the central portion 101-21; 102-21, in accordance with one or more embodiments. Analogous definitions may apply with regards the edge portion 102-23 mentioned further below.

Further, both terms "central average dopant dose" and "peripheral average dopant dose" (as well as "edge average dopant dose" mentioned below) refer to electrically activate dopants of the same conductivity type. Hence, a change in average dopant dose may also be achieved by keeping the dose of one dopant type constant in both portions and by applying a counter-doping and/or damage-doping. Also by such means, the difference between the (net) average dopant doses can be achieved.

Furthermore, it shall be understood that the integration path according to which the average dopant dose is determined does not extend beyond the boundaries of the first doped semiconductor region 101 or, respectively the second doped semiconductor region 102. For example, with respect to the first doped semiconductor region 101, the integration path terminates latest where the first doped semiconductor region 101 (e.g., p-type emitter) forms a pn-junction with the drift region 100 (e.g., n-drift region). Also, with respect to the second doped semiconductor region 102, the integration path terminates latest where the second doped semiconductor region 102 (e.g., p-type emitter in case of an IGBT/RC-IGBT) forms a pn-junction with the drift region 100 (e.g., n-drift region) or, respectively, with a field stop region (not illustrated) that may be arranged between the drift region 100 and the second doped semiconductor region 102. In case the second doped semiconductor region 102 is of the same conductivity type as the drift region 100 (e.g., in case the power semiconductor device 1 is a diode or a MOSFET), against the vertical direction Z, the average dopant dose in the peripheral volume 1-22 does at some point not differ any more from the average dopant dose in the central volume 1-21, as the drift region 100 extends, without change in dopant dose, into both volume parts 1-21, 1-22.

Hence, in accordance with some or all embodiments described herein, the respective dopant dose can be defined by the dopant concentration integrated along the vertical direction Z pointing from the first load terminal 11 to the second load terminal 12 and in a section in proximity to the respective load terminal 11; 12. For example, the average dopant dose of the second doped semiconductor region 102 is determined in a layer of the second doped semiconductor region 102 of less than 5 thickness along the vertical direction Z and spaced apart from the second load terminal 12 no further than 2 μm along the vertical direction Z, and, for example, the average dopant dose of the first doped semiconductor region 101 is determined in a layer of the first doped semiconductor region 101 of less than 30 um thickness along the vertical direction Z and spaced apart from the first load terminal 11 no further than 2 μm along the vertical direction Z.

Various options of designing the power semiconductor device 1 with a specific spatial load current/temperature distribution will now be discussed with respect to the remaining drawings.

Figure 4A:
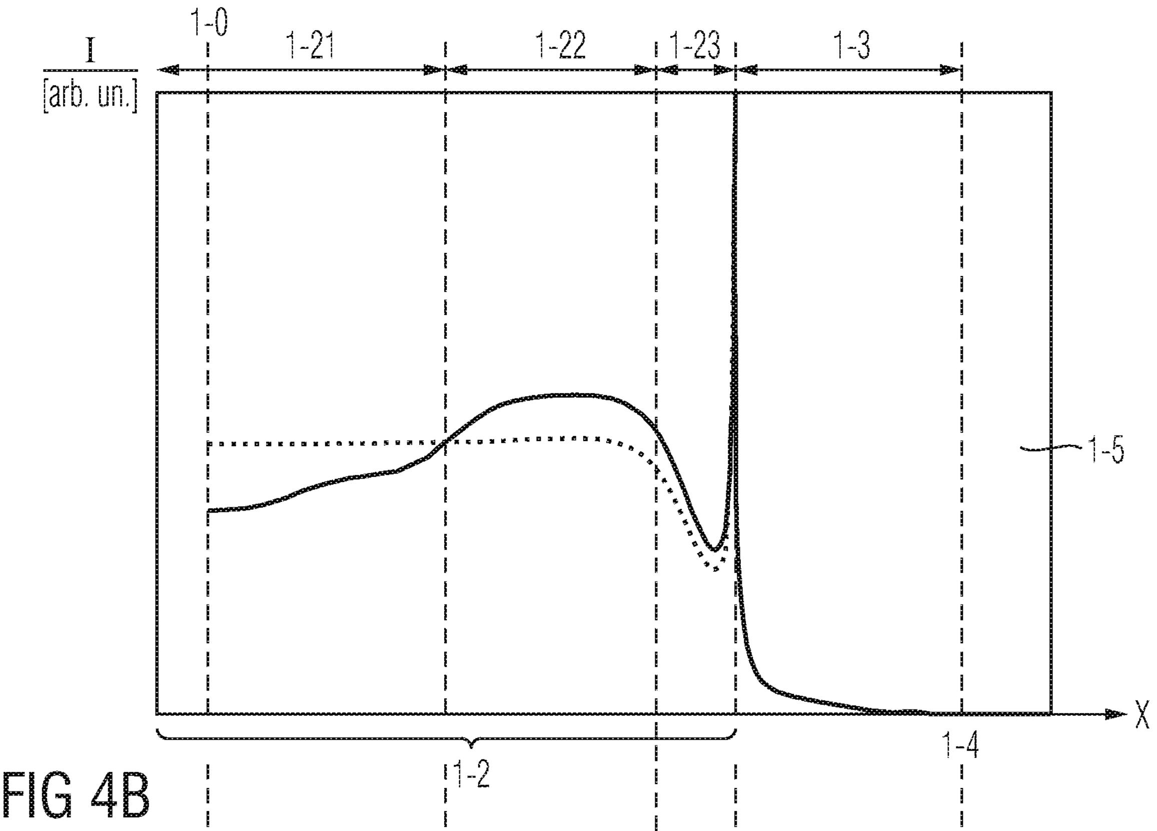
FIGS. 4A-4B schematically and exemplarily illustrate courses of a load current density and a temperature along a lateral direction in a power semiconductor device in accordance with one or more embodiments as compared to a reference diode.
Figure 4B:
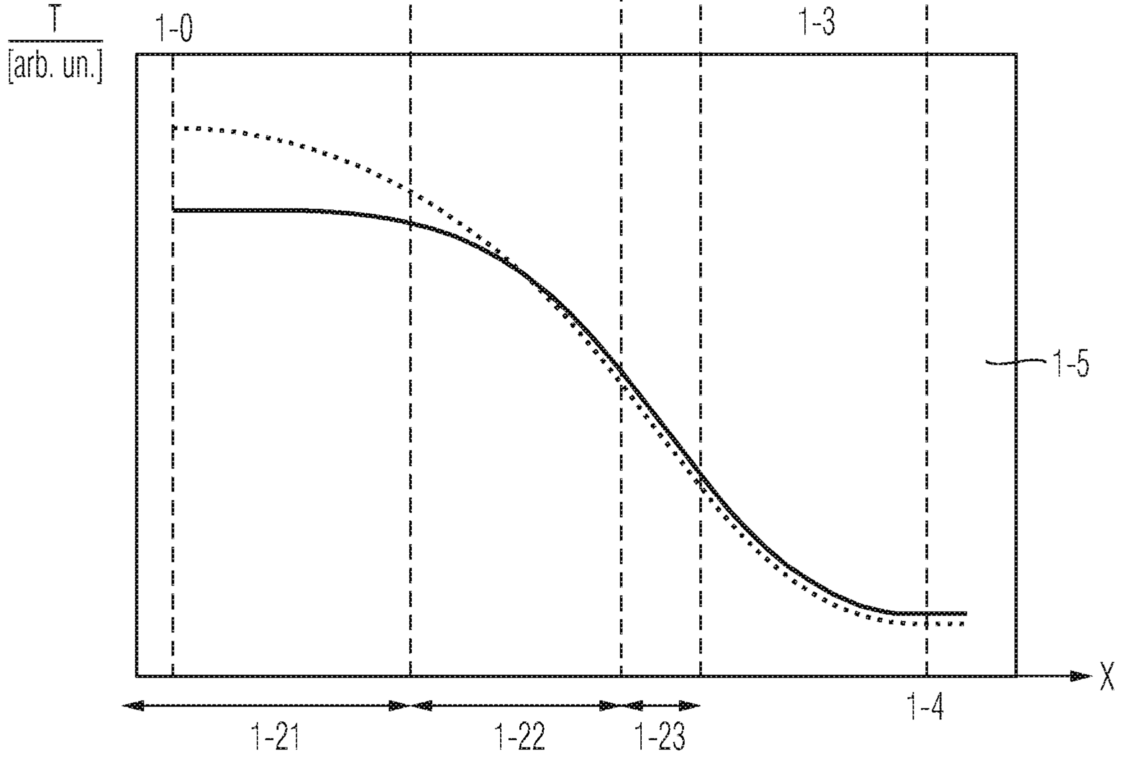

For example, referring to FIGS. 4A-B, which both relate to an embodiment where the power semiconductor device 1 is implemented as a diode (and, accordingly, the first doped semiconductor region 101 is an anode region and the second doped semiconductor region 102 is a cathode region), the peripheral average dopant dose of the second doped semiconductor region 102 is greater than the central average dopant dose of the second doped semiconductor region 102, e.g., the central average dopant dose is lower than the peripheral average dopant dose by at least 5%, or by at least 10%, or by at least 50%. That is, in an embodiment, the peripheral average dopant dose may be twice as great as the central average dopant dose.

FIG. 4A and FIG. 4B illustrate a spatial load current density (FIG. 4A) and a spatial temperature distribution (FIG. 4B) along the first lateral direction X. The dotted line refers to a reference diode which does not exhibit the herein described difference between the central average dopant dose and the peripheral average dopant dose but a cathode region that is homogenously doped with respect to both the active volume and the peripheral volume. The continuous line in both FIGS. 4A and 4B refers to the embodiment explained in the preceding paragraph. Accordingly, referring to FIG. 4A, the reference diode has a load current density that does basically not change at a transition between the central volume 1-21 and the peripheral volume 1-22 (due to the homogenously doped cathode), but only in proximity to a transition between the active region 1-2 and the edge termination region 1-3. This quasi homogenous load current density in the active region of the reference diode is correspondingly reflected by the temperature distribution (FIG. 4B), which has a peak in the central volume of the reference diode. In contrast, such high peak in the central volume 1-21 of the active region 1-2 of the diode in accordance with the embodiment is avoided by the increased average dopant dose in the peripheral portion 102-22 of the second doped semiconductor region 102. Such increased dopant dose may even yield a load current density that is increased in the peripheral volume 1-22 compared to the load current density in the central volume 1-21.

In the outermost peripheral volume 1-23, which may separate the peripheral volume from the edge termination region 1-3, the dopant dose of the second doped semiconductor region 102 may decrease again, which is reflected by the decrease in the load current density (FIG. 4A). For example, various designs are possible for the dopant dose of the second doped semiconductor region 102 in the outermost peripheral volume 1-23, e.g., for fulfilling a HDR (High Dynamic Robustness) concept or the like. For example, some designs also provide for an increased (instead of a decreased) dopant dose of the second doped semiconductor region 102 in the outermost peripheral volume 1-23.

FIGS. 4A-B further schematically illustrate the both the central vertical axis 1-0 (cf. also FIG. 1) of the active region 1-2, and the position of the dicing line, where the edge 1-4 of the edge termination region 1-3, i.e., the edge of the semiconductor body 10, can be covered by means of a protective material, such as a module gel 1-5.

Figure 5A:
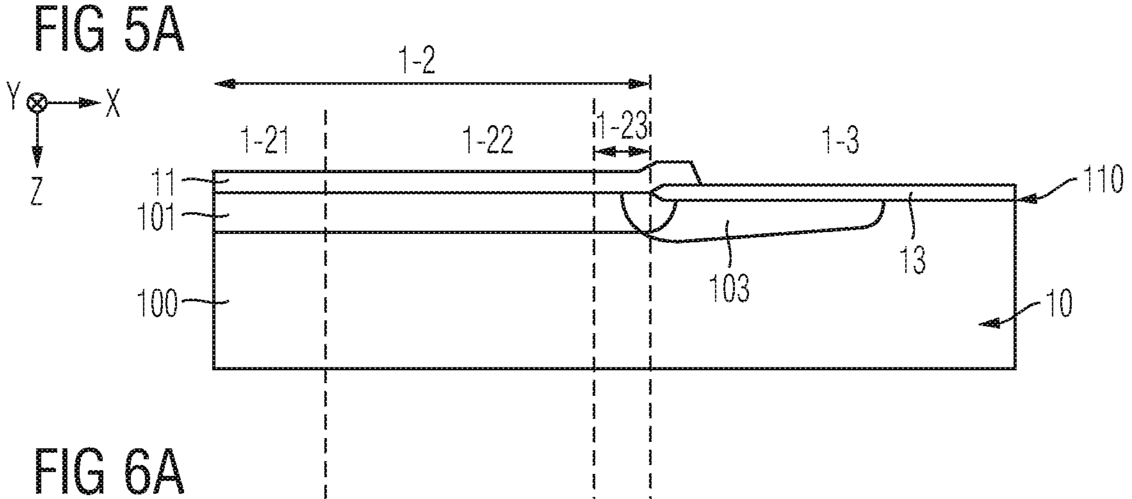
FIGS. 5A-5B schematically and exemplarily illustrate sections of a vertical cross-section of a reference diode.

FIG. 5A schematically and exemplarily illustrates a section of a vertical cross-section of a reference diode. In accordance with the design of the reference diode, the first doped semiconductor region 101 (e.g., a p-doped anode region) is homogeneously doped along the first lateral direction X within the active region 1-2, i.e., without any change between the central volume 1-21 and the peripheral volume 1-22. However, depending on the chosen design option, the dopant dose may (or may not) change in the outermost peripheral volume 1-23. The outermost peripheral volume 1-23 is presently of less interest.

Still referring to the design of the reference diode, with the beginning of the edge termination region 1-3, the first doped semiconductor region 101 may seamlessly join into a third doped semiconductor region 103, which may be of the same conductivity type as the first doped semiconductor region 101 (in the illustrated example: also p-doped) and/or which may have a VLD (Variation-of-the-Lateral-Doping) structure along the first lateral direction X (and, of course, also along the other lateral directions Y and R). Also, the third doped semiconductor region 103 may be electrically connected with the first load terminal 11, but as illustrated, mainly covered by means of an insulation structure 13. The third doped semiconductor region 103 may extend along the frontside 110 within the edge termination region 1-3.

FIGS. 6A-D schematically and exemplarily illustrate various vertical cross-sections of the power semiconductor device 1 in accordance with some embodiments, where the central average dopant dose of the first doped semiconductor region 101 differs from the average peripheral dopant dose by at least −5%, i.e., embodiments where the peripheral average dopant dose of the first doped semiconductor region 101 is significantly increased compared its central average dopant dose.

In the examples illustrated in FIGS. 6A-D, the power semiconductor device 1 may be a diode, e.g., having a single power cell 1-1 in the active region 1-2 (cf. FIG. 2C). The first doped semiconductor region 101 can be a p-doped anode region. The second doped semiconductor region 102 (not illustrated) can be an n-doped cathode region that is homogenously doped along the lateral directions X, Y, R in the active region 1-2, as illustrated in FIGS. 6A-D, or that is in homogenously doped along the lateral directions X, Y, R in the active region 1-2, as illustrated in FIGS. 8A-B.

In an embodiment, the first doped semiconductor region 101 comprises the central portion 101-21, which, for example, exclusively extends within the central volume 1-21, and which, for example, may there be arranged in contact with the first load terminal 11. The first doped semiconductor region 101 further comprises the peripheral portion 101-22, which, for example, exclusively extends within the peripheral volume 1-22, and which, for example, may there be arranged in contact with the first load terminal 11. The first doped semiconductor region 101 may further comprises a portion which extends within the outermost peripheral volume 1-23, and which, for example, may there be at least partially arranged in contact with the first load terminal 11.

In accordance with the embodiments illustrated in FIGS. 6A-D, the active region 1-2 comprises the peripheral volume 1-22 and the outermost peripheral volume 1-23. The outermost peripheral volume 1-23, which forms at least 5% of the total volume of the active region 1-2, is arranged between the peripheral volume 1-22 and the edge termination region 1-3. As illustrated, the transition between the active region 1-2 (i.e., its outermost peripheral volume 1-23) and the edge termination region 1-3 may be formed at a lateral boundary of the contact between the first load terminal 11 and the semiconductor body 10.

Figure 6A:
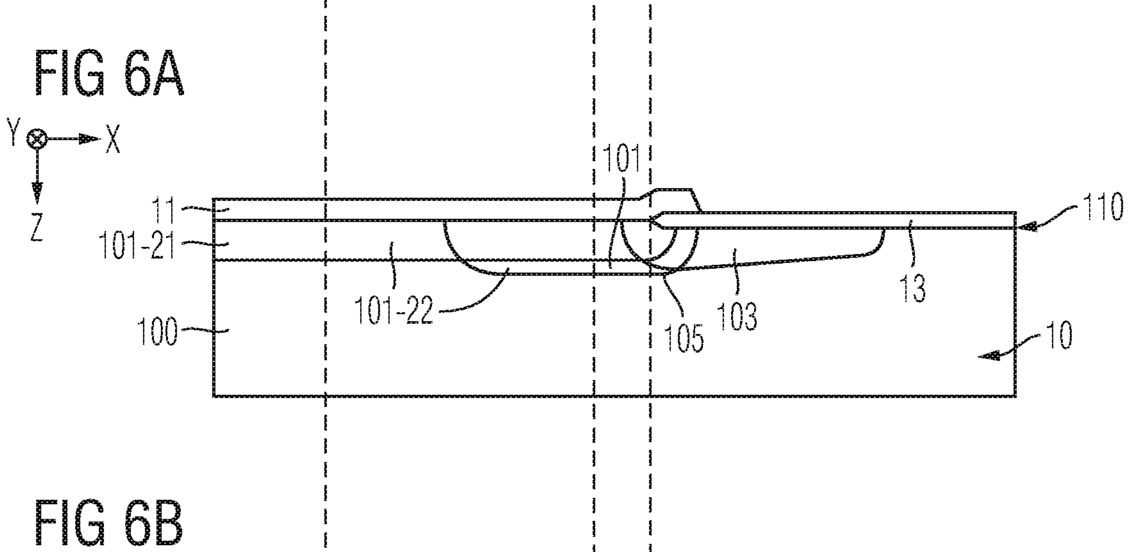
FIGS. 6A-6D schematically and exemplarily illustrate various vertical cross-sections of a power semiconductor device having a first doped semiconductor region with an increased average dopant dose in a peripheral volume in accordance with some embodiments.

For example, in accordance with the embodiment illustrated in FIG. 6A, the increased average dopant dose of the first doped semiconductor region 101 in the peripheral volume 1-22 is achieved by "conventionally" producing the first doped semiconductor region 101 (e.g., in a manner as it is produced for the reference diode) and by means of an additive photo/lithographic technique and an additional implantation processing step for producing a supplemental doped semiconductor portion 105 in the peripheral volume 1-22, as illustrated. For example, due the supplemental doped semiconductor portion 105, an increased emitter functionality is achieved for the peripheral portion 101-22 of the first doped semiconductor region 101 in the peripheral volume 1-22, thereby increasing the current density in the peripheral volume 1-22.

Regarding all embodiments of FIGS. 6A-D, it shall be understood that the illustrated dopant profile may be equally present throughout the entire peripheral volume 1-22 (cf. FIG. 1), e.g., yielding, in a horizontal projection, a ring like structure.

Figure 6B:
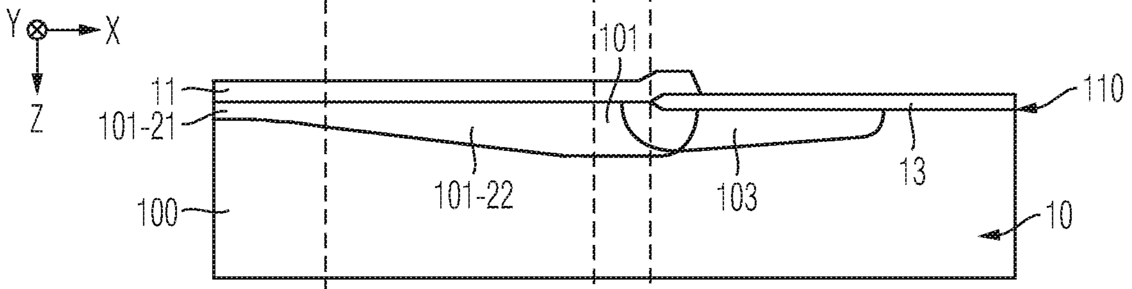

In accordance with the embodiment illustrated in FIG. 6B, the increased average dopant dose of the first doped semiconductor region 101 in the peripheral volume 1-22 is achieved by "unconventionally" producing the first doped semiconductor region 101 such that the first doped semiconductor region 101 has a VLD structure in the peripheral volume 1-22 of the active region 1-2, e.g., a VLD structure according to which the dopant dose increases in a direction towards the edge termination region 1-3. Such increase in the average dopant dose may be reflected by the peripheral portion 101-22 extending slightly further along the vertical direction Z as compared to the central portion 101-21.

Figure 6C:
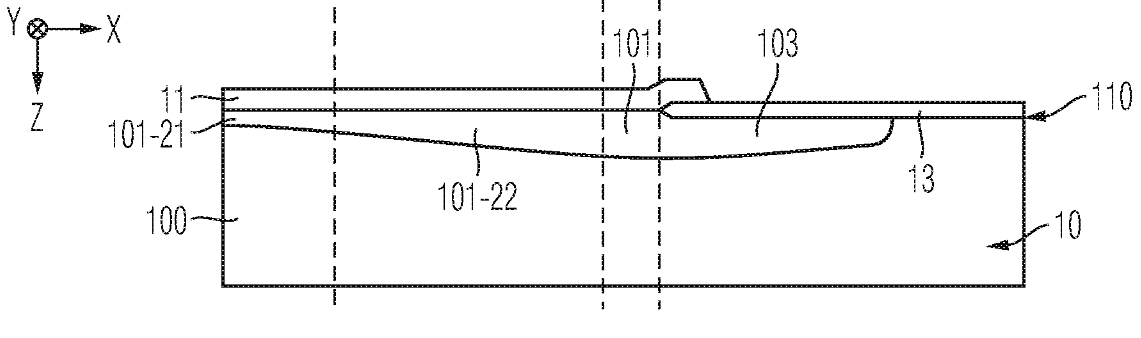

In accordance with the embodiment illustrated in FIG. 6C, the increased dopant dose of the first doped semiconductor region 101 in the peripheral volume 1-22 is achieved by unconventionally producing simultaneously both the first doped semiconductor region 101 and the third doped semiconductor region 103, for example such that both the first and the third doped semiconductor region 101, 103 have a VLD structure in the peripheral volume 1-22 of the active region 1-2 or, respectively, a VLD structure in the edge termination region 1-3, e.g., a VLD structure according to which the dopant dose increases in a direction towards the edge termination region 1-3 so to reach a maximum approximately in the outermost peripheral volume 1-23. For example, such lateral dopant profile may be achieved by using a correspondingly designed mask. Such mask may exhibit a plurality of openings that increase in at least one of the number and the size along the lateral directions X, Y and R. When using such mask during an implantation processing step (or any other dopant providing step), the average dopant dose of the first semiconductor region 101 in the peripheral volume may be increased, as described above.

Figure 5B:
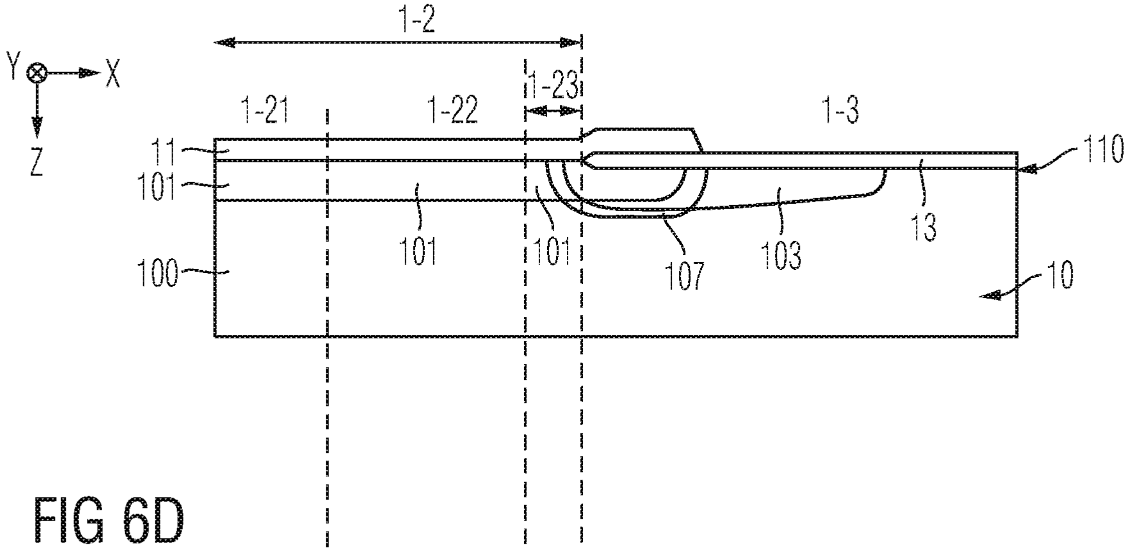

FIG. 5B schematically and exemplarily illustrates a further section of a vertical cross-section of a reference diode, which mainly corresponds to the example shown in FIG. 5A, but where an additional doped semiconductor region 107 is provided. The additional doped semiconductor region 107 can be of the same conductivity type as the first doped semiconductor region 101 (e.g., p-doped) and is arranged at the transition between the active region 1-2 and the edge termination region 1-3 such that it extends at least into the outermost peripheral volume 1-23, e.g., into both the first and the third doped semiconductor region 101, 103. For example, within the outermost peripheral volume 1-23, the first doped semiconductor region 101 seamlessly joins first into the additional doped semiconductor region 107 and then, within the edge termination region 1-3, into the third doped semiconductor region 103, which may be of the same conductivity type as the first doped semiconductor region 101 (in the illustrated example: also p-doped) and/or which may have the VLD structure along the lateral directions as explained above.

Figure 6D:
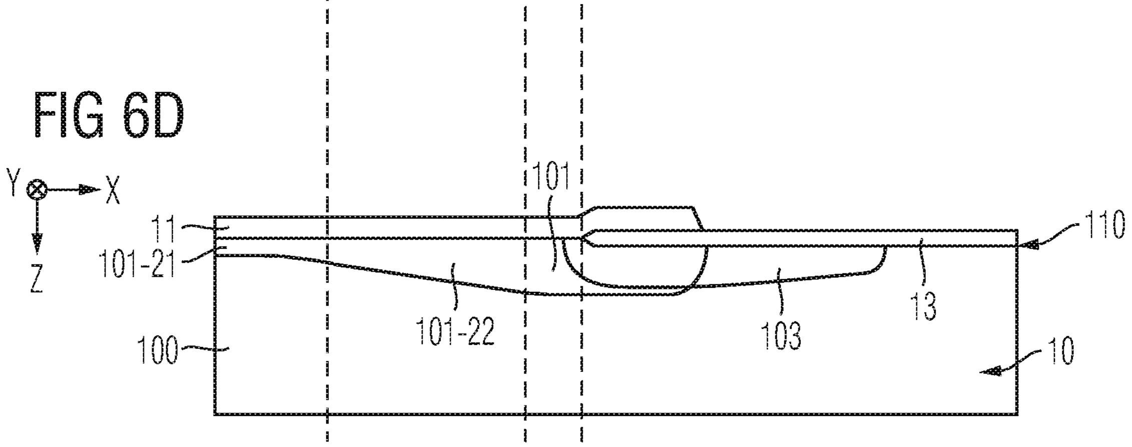
Figure 15:
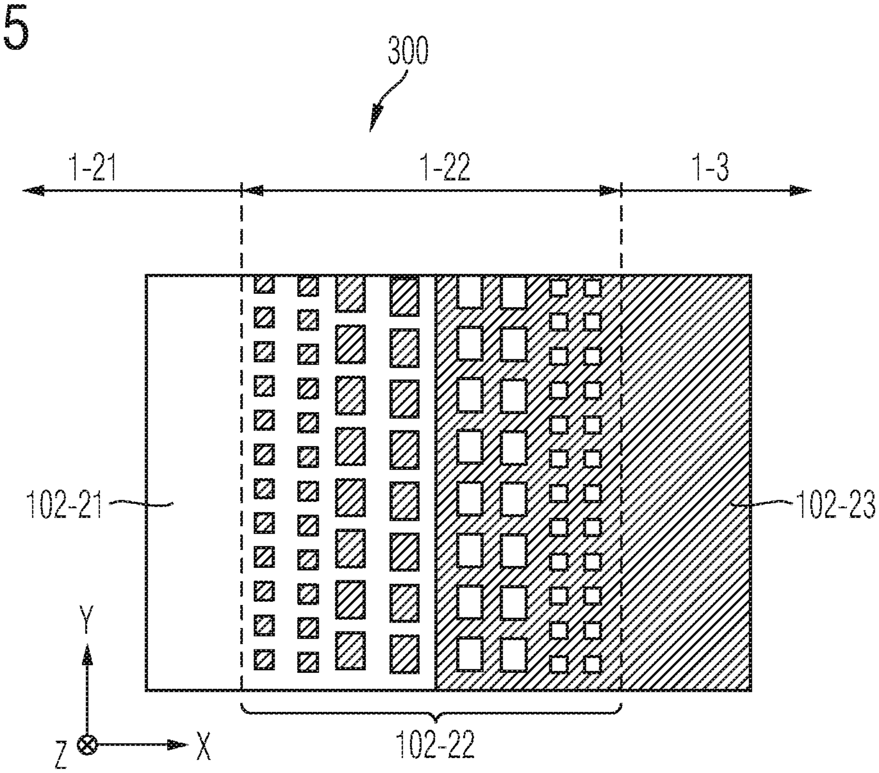

Based on the reference design illustrated in FIG. 5B, for example, in accordance with the embodiment illustrated in FIG. 6D, the increased dopant dose of the first doped semiconductor region 101 in the peripheral volume 1-22 can be achieved by extending the mask used for forming the additional doped semiconductor region 107 into the active region 1-2 and providing mask openings with varying size (e.g., opposite to the concept illustrated in FIG. 15 which provides for a decreasing dopant dose).

Figure 7:
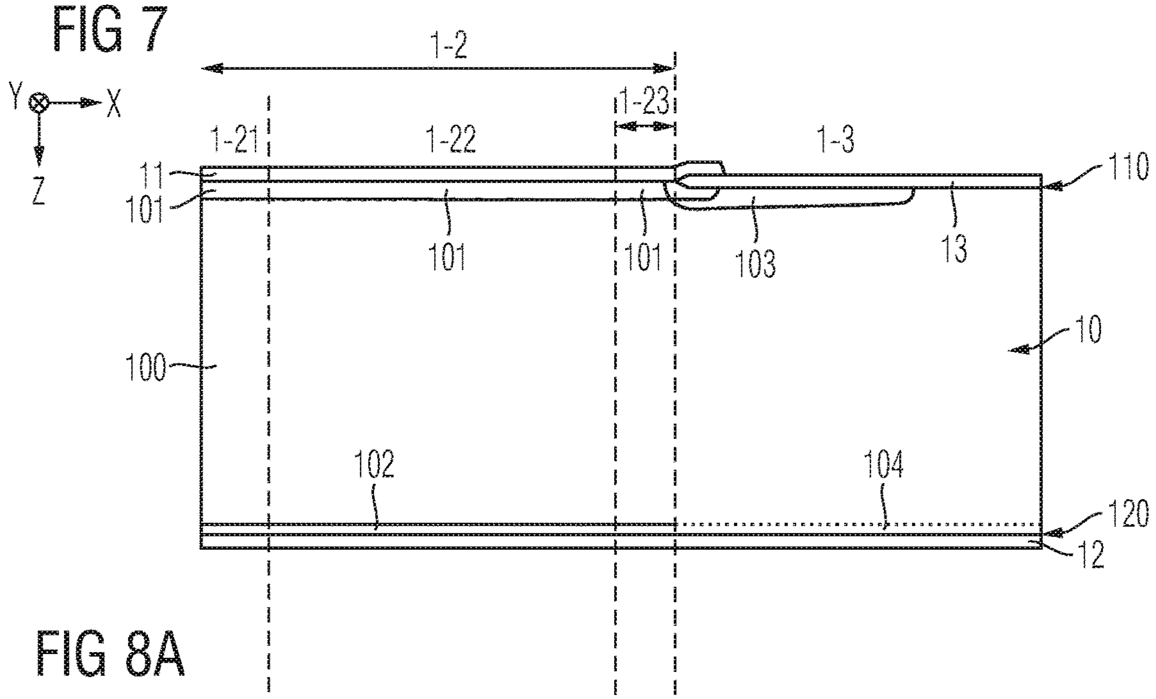

With regards to FIGS. 7 and BA-B, further options for providing the central average dopant dose that is lower than the peripheral average dopant dose by at least 5% shall be explained, wherein these further options can be combined with the designs explained based on FIGS. 6A-D. Thus, what has been stated with respect to FIGS. 6A-D may equally apply to the embodiments illustrated in FIGS. 8A-B.

First referring to FIG. 7, which schematically and exemplarily illustrates a section of a vertical cross-section of a reference diode, it can be seen that, typically, within the active region 1-2, the structures of the first doped semiconductor region 101 and the second doped semiconductor region 102 in the central volume 1-21 do not differ from the structures of the first doped semiconductor region 101 and the second doped semiconductor region 102 in the peripheral volume 1-22. A difference in structure is typically observed at the transition from the active region 1-2 to the edge termination region 1-3, e.g., sometimes already in the outermost peripheral volume 1-23. As explained above, the first doped semiconductor region 101 may there join into said third doped semiconductor region 103 having a different average dopant dose than the first doped semiconductor region 101. In a similar manner, the second doped semiconductor region 102 may, at said transition, join into a fourth doped semiconductor region 104 that may be of the same conductivity type as the second doped semiconductor region and/or that may be also electrically connected to the second load terminal 12. However, in some known reference diode implementations which are based on the so-called High-Dynamic-Robustness (HDR) concept, the fourth doped semiconductor region 104 is not provided in the edge termination region 1-3 or, respectively, at least not electrically connected to the second load terminal 12 so as to avoid extending the cathode functionality from the active region 1-2 into the edge termination region 1-3. That concept may already be implemented at least partially within the outermost peripheral volume 1-23. In order to illustrate this optionality, the fourth doped semiconductor region 104 is illustrated by means of the dotted line. That is: Since the omission of the fourth doped semiconductor region 104 may already be initiated within the outermost peripheral volume 1-23 of the active region 1-2 in proximity to the edge termination region 1-3, according to the design of the reference diode, the peripheral average dopant dose may even decrease in the outermost peripheral volume 1-23 as compared to the central average dopant dose in the central volume 1-21 of the active region 1-1.

Also in accordance with the examples illustrated in FIGS. 8A-B, the power semiconductor device 1 may be a diode, e.g., having a single power cell 1-1 in the active region 1-2 (cf. FIG. 2C). The first doped semiconductor region 101 can be a p-doped anode region that is either homogenously doped along the lateral directions X, Y, R in the active region 1-2 (as illustrated) or, respectively, inhomogenously doped along the lateral directions X, Y, R in the active region 1-2, e.g., in one of the manners as described above with respect to FIGS. 6A-D. The second doped semiconductor region 102 can be an n-doped cathode region that is inhomogenously doped along the lateral directions X, Y, R in the active region 1-2, as will now be explained with respect to FIGS. 8A-B.

In an embodiment, the second doped semiconductor region 102 comprises the central portion 102-21, which, for example, exclusively extends within the central volume 1-22, and which, for example, may there be arranged in contact with the second load terminal 12. The second doped semiconductor region 102 further comprises the peripheral portion 102-22, which, for example, exclusively extends within the peripheral volume 1-22, and which, for example, may there be arranged in contact with the second load terminal 12. The second doped semiconductor region 102 may further comprises a portion which extends within the outermost peripheral volume 1-23, and which, for example, may there be at least partially arranged in contact with the second load terminal 12.

In accordance with the embodiments illustrated in FIGS. 8A-B. the active region 1-2 comprises the peripheral volume 1-22 and the outermost peripheral volume 1-23. The outermost peripheral volume 1-23, which forms at least 5% of the total volume of the active region 1-2, is arranged between the peripheral volume 1-22 and the edge termination region 1-3. As illustrated, the transition between the active region 1-2 (i.e., its outermost peripheral volume 1-23) and the edge termination region 1-3 may be formed at a lateral boundary of the contact between the first load terminal 11 and the semiconductor body 10.

For example, in accordance with the embodiment illustrated in FIG. 8A, the increased average dopant dose of the second doped semiconductor region 102 in the peripheral volume 1-22 is achieved by applying an implantation processing step, e.g., using a backside photo technique, e.g., in a similar manner as compared to implementing the HDR concept. The peripheral portion 102-22 of the second doped semiconductor region 102 may exhibit a VLD like dopant profile along the first lateral direction X.

Regarding the embodiments of FIGS. 8A-B, it shall be understood that the illustrated and described dopant profile may be equally present throughout the entire peripheral volume 1-22 (cf. FIG. 1), e.g., yielding, in a horizontal projection, a ring like structure.

Now referring to the embodiment illustrated in FIG. 8B, the increased average dopant dose of the second doped semiconductor region 102 in the peripheral volume 1-22 can be achieved by modifying a mask layout for the peripheral volume 1-22, e.g., in that the density of mask openings is increased, thereby achieving a greater density of local emitters. Here, it shall be pointed out that the second doped semiconductor region 102 must not necessarily monolithically extend within the active volume 1-21 and/or within the peripheral volume 1-22. Rather, as illustrated in FIG. 8B, the second doped semiconductor region 102 may also be laterally structured within the central volume 1-21 and/or within the peripheral volume 1-22, e.g., in that the second doped semiconductor region 102 comprises a plurality of local emitters spaced apart from each other along one or more of the lateral directions X, Y and R. For example, at least one of the density and/or the size of such local emitters may be increased in the peripheral volume 1-22 (compared to the central volume 1-21) so as to achieve the described negative difference between the central average dopant dose of the second doped semiconductor region 102 and the peripheral average dopant dose of the second doped semiconductor region 102 of at least 5%. Thus, it shall further be understood that the second doped semiconductor region 102 must not necessarily seamlessly joint into the fourth doped semiconductor region 104.

In the embodiments described above with respect to FIGS. 4A-8B, the central average dopant dose of the first doped semiconductor region 101 and/or the second doped semiconductor region 102 is lower as compared to the peripheral average dopant dose of the first doped semiconductor region 101 and/or, respectively, the second doped semiconductor region 102. As explained, such difference in the average dopant dose(s) may yield an increased load current density in the peripheral volume 1-22, which in turn may yield a more homogenous temperature distribution within the total volume of the active region 1-2, e.g., avoiding a (significant) temperature peak in the center of the active region 1-2 (cf. FIG. 4B).

Furthermore, the embodiments described above with respect to FIGS. 4A-8B have been explained with exemplary respect to a diode. However, it shall be understood that these embodiments may be equally implemented in case the power semiconductor device 1 is, e.g., an IGBT or a MOSFET, in which case the first doped semiconductor region 101 would be the p-body region at the frontside of the IGBT's or, respectively, the MOSFET's semiconductor body and/or in which case the second doped semiconductor region 102 can be the p-emitter at the backside of the IGBT's semiconductor body or, respectively, the n-emitter at the backside of the MOSFET's semiconductor body.

In accordance with the embodiments described in the following with respect to FIGS. 9 to 15, the central average dopant dose of the second doped semiconductor region 102 (which is electrically connected with the second load terminal 12 at the semiconductor body backside 120) can be greater as compared to the peripheral average dopant dose of the second doped semiconductor region 102. For example, such configuration may increase device reliability if the remaining design of the device may tolerate an eventual temperature peak in the center of the active region 1-2 and/or other means, e.g., designated cooling means, are provided for avoiding such temperature peak.

However, it shall be made clear that both design variants. i.e., those described with respect to FIGS. 4A-8B above, and those described in the following with respect to FIGS. 9 to 15, can be combined with each other, i.e., simultaneously be implemented.

In accordance with the following embodiments, the decreased average dopant dose in the peripheral volume 1-22 will be described with exemplary respect to the second doped semiconductor region 102.

Figure 9:
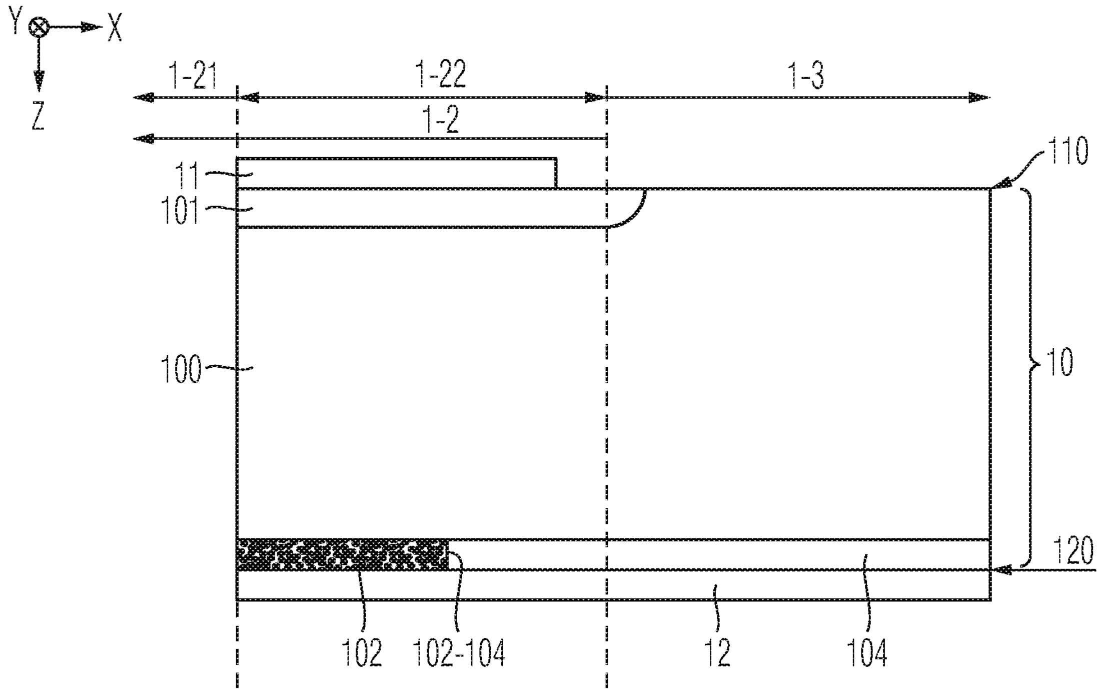

Similar to FIG. 7, FIG. 9 schematically and exemplarily illustrates a section of a vertical cross-section of a reference diode or, respectively, of a reference IGBT. As illustrated, in the peripheral volume 1-22, the second doped semiconductor region 102 seamlessly joins, in proximity to the transition between the active region 1-2 and the edge termination region 1-3, into the fourth doped semiconductor region 104, wherein the fourth doped semiconductor region 104 is of the same conductivity type as the second doped semiconductor region 102 and extends along the backside 120 within the edge termination region 1-3. As already explained above, e.g., if the HDR concept is implemented or, respectively, for other reasons, the fourth doped semiconductor region 104 may exhibit a significantly smaller average dopant dose as compared to the average dopant dose of the second doped semiconductor region 102. For example, the central average dopant dose of the second doped semiconductor region 102 is at least four times, or even at least ten times as large as the average dopant dose of the fourth doped semiconductor region 104 in the edge termination region 1-3. Hence, in the in the peripheral volume 1-22, in proximity to the transition between the active region 1-2 and the edge termination region 1-3, there may be an abrupt change of the average dopant dose at the transition 102-104 between the second doped semiconductor region 102 and the fourth doped semiconductor region 104 along the lateral direction X in accordance with the design of the reference diode (which may analogously be implemented in other reference designs, e.g., in an IGBT or MOSFET design). The abrupt change in the emitter efficiency caused by the transition 102-104 may lead to an increased current density at the high-efficiency side of the transition 102-104.

The embodiments illustrated in each of FIGS. 10A to 15 include the idea to replace such abrupt transition 102-104 with a smooth transition by gradually decreasing the average dopant dose of the emitter towards the edge 1-4 (which does not necessarily imply that the average dopant dose in the peripheral volume 1-22 is smaller than the average dopant dose in the central volume 1-21).

In accordance with the embodiments illustrated in each of FIGS. 10A to 15, the power semiconductor device 1, which can be an IGBT, for example, comprises the active region 1-2 with the at least one power cell 1-1 (more typically several hundred), wherein the active region 1-2 has the total volume, the total volume having the central volume 1-21 forming at least 80% of the total volume. The peripheral volume 1-22 surrounds the central volume 1-21. The edge termination region 1-3 is arranged external of the active region 1-2 and surrounds the peripheral volume 1-22. Here, it shall be made clear that the peripheral volume 1-22 may be comprised by either the active region 1-2 or the edge termination region 1-3, or may extend into both the active region 1-2 and the edge termination region 1-3. The semiconductor body 10 has the frontside 110 and the backside 110, wherein the semiconductor body 10 forms a part of each of the active region 1-2, the peripheral volume 1-22 and the edge termination region 1-3. The semiconductor body 10 has the total thickness along the vertical direction Z between the frontside 110 and the backside 120. The peripheral volume 1-22 has a lateral extension amounting to at least half, or to at least 100% of the total semiconductor body thickness. As elucidated earlier, the device 1 can have a symmetric design with respect to the central vertical axis 1-0, e.g., a design according to which the minimal lateral extension of the peripheral volume 1-22 is present in each lateral direction X, Y and R. The power semiconductor device 1 further comprises the first load terminal 11 (e.g., an emitter terminal) at the semiconductor body frontside 110 and the second load terminal 12 at the semiconductor body backside 120; the first doped semiconductor region 101 formed in the semiconductor body 10 (e.g., a p-body region) and electrically connected with the first load terminal 11; the second doped semiconductor region 102 formed in the semiconductor body 10 (e.g., a p-emitter region) and electrically connected with the second load terminal 12. The second doped semiconductor region 102 has a central portion 102-21 extending into the central volume 1-21 of the active region 1-2 and having a central average dopant dose; a peripheral portion 102-22 extending into the peripheral volume 1-22 and having a peripheral average dopant dose with, along the lateral extension of the peripheral volume, a negative gradient in a lateral direction towards the edge termination region 1-3; and an edge portion 102-23 extending into the edge termination region 1-3 and having an edge average dopant dose, wherein the edge average dopant dose is lower than the central average dopant dose, e.g., by at least 5%.

In accordance with the embodiments illustrated in each of FIGS. 10A to 15, the peripheral average dopant dose of the second doped semiconductor region 102 decreases along at least one of the lateral directions R, X, Y (that point from central volume 1-21 to the edge termination region 1-3). Regarding all embodiments described in the following, it shall again be understood that the illustrated profiles may be equally present throughout the entire peripheral volume 1-22 (cf. FIG. 1), e.g., yielding, in a horizontal projection, a ring like structure.

In an embodiment, the edge portion 102-23 of the second doped semiconductor region 102 may correspond to the fourth doped semiconductor region 104 mentioned above. The power semiconductor device 1 can be an IGBT or a MOSFET and the semiconductor body 10 in the active region 1-2 can be configured to conduct the IGBT/MOSFET load current between the first load terminal 11 and the second load terminal 12.

Furthermore, in an embodiment, the peripheral average dopant dose (e.g., integrated over the entire lateral extension of the peripheral volume 1-22) may be lower than the central average dopant dose (e.g., integrated over the entire lateral extension of the central volume 1-21), e.g., the peripheral average dopant dose amounts to no more than 80% of the central average dopant dose. Additionally or alternatively, the peripheral average dopant dose (e.g., integrated over the entire lateral extension of the peripheral volume 1-22) may be greater than the edge average dopant dose (e.g., integrated over the entire lateral extension of the edge termination region 1-3), e.g., the peripheral average dopant dose amounts to more than 120% of the edge average dopant dose.

Hence, in accordance with embodiments described herein, the peripheral average dopant dose can be lower than the central average dopant dose by at least 20%, and the peripheral average dopant dose can be greater than the edge average dopant dose by at least 20%.

For example, referring to FIGS. 10A-13, which schematically and exemplarily illustrate various vertical cross-sections of the power semiconductor device 1 having the second doped semiconductor region 102 with a decreasing average dopant dose in the peripheral volume 1-22, i.e., with, along the lateral extension of the peripheral volume 1-22, the negative gradient in the lateral direction towards the edge termination region 1-3 in accordance with some embodiments, the decrease of the peripheral average dopant dose of the peripheral portion 102-22 of the second doped semiconductor region 102 along the lateral direction can be below a maximal rate. Such gradual decrease of the average dose is schematically illustrated by the correspondingly shade regions of the second doped semiconductor region 102.

For example, the negative gradient of the peripheral average dopant dose of the second doped semiconductor region 102 (i.e., in the peripheral portion 102-22) along the lateral direction towards the edge 1-4 is smaller than, e.g., 5% per 1 μm, or even smaller than 1% per 1 μm. For example, this means that the average dopant dose may amount to, averaged along a first distance of 1 μm, a first value, and averaged along a second distance of 1 μm subsequent to the first distance, a second value, wherein the second value amounts to at least 95% (negative gradient of 5% per 1 μm, which means, e.g., that the dopant dose decreases by a factor of 1/e (~0.37) along a distance of 20 μm) or, respectively, at least 99% (negative gradient of 1% per 1 μm, which means, e.g., that the dopant dose decreases by a factor of 1/e along a distance of 100 μm) of the first value.

Furthermore, in an embodiment, the aforementioned maximal rates of change, i.e., the maximal gradients, may be present for at least 80% of the total lateral extension of the peripheral volume 1-22, which may amount to at least, as explained above, 50% or even at least 100% of the total semiconductor body thickness. Hence, peripheral average dopant dose of the peripheral portion 102-22 of the second doped semiconductor region 102 may moderately decrease along the lateral direction towards the edge termination region 1-3 (i.e., towards the edge 1-4).

For example, the peripheral average dopant dose of the second doped semiconductor region 102 decreases, in the peripheral volume 1-22 and along the lateral direction towards the edge 1-4, from a value amounting to at least 80% of the central average dopant dose, to a value amounting to at most 120% of the edge average dopant dose of the edge portion 102-23.

Furthermore, said decrease of the peripheral average dopant dose of the second doped semiconductor region 102 may occur gradually along a distance amounting to at least 30%, or to at least 50%, or to at least 80% of the total lateral extension of the peripheral volume 1-22.

It may be provided that the average dopant dose of the second doped semiconductor region 102 decreases along the lateral direction towards the edge 1-4 from a maximal value in the central volume 1-21 to a minimal value in the peripheral volume 1-22, wherein said decrease occurs gradually along a lateral distance within the range of 20% to 150%, or within the range corresponding to 50% to 100% of the total semiconductor body thickness along the vertical direction Z.

Figure 10A:
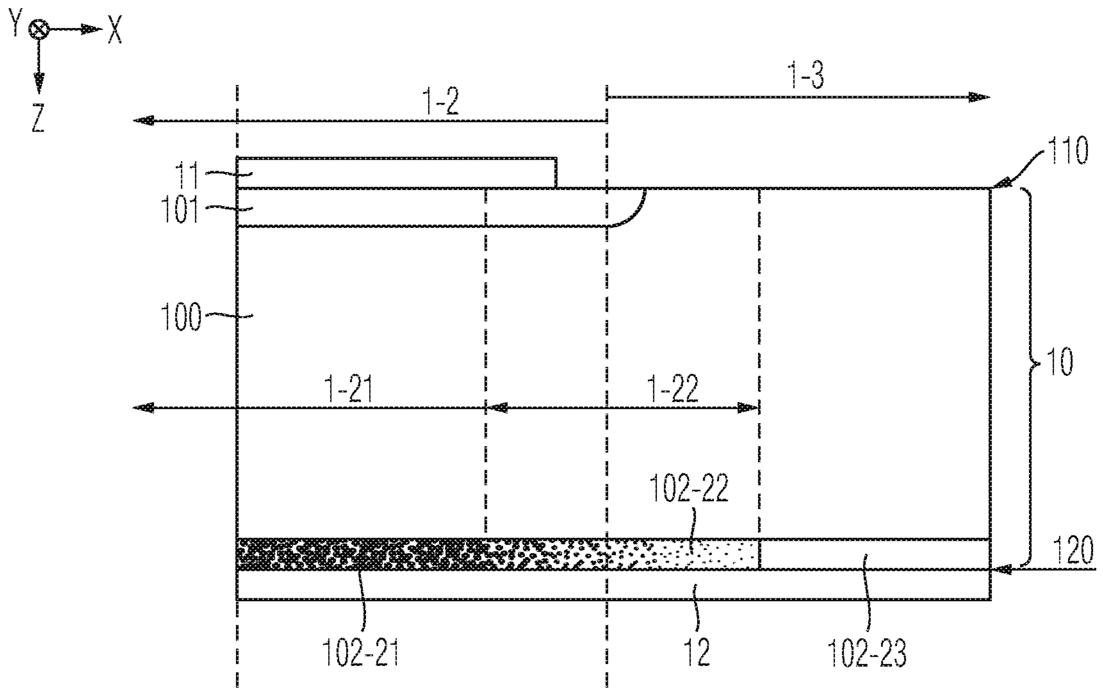
Figure 10B:
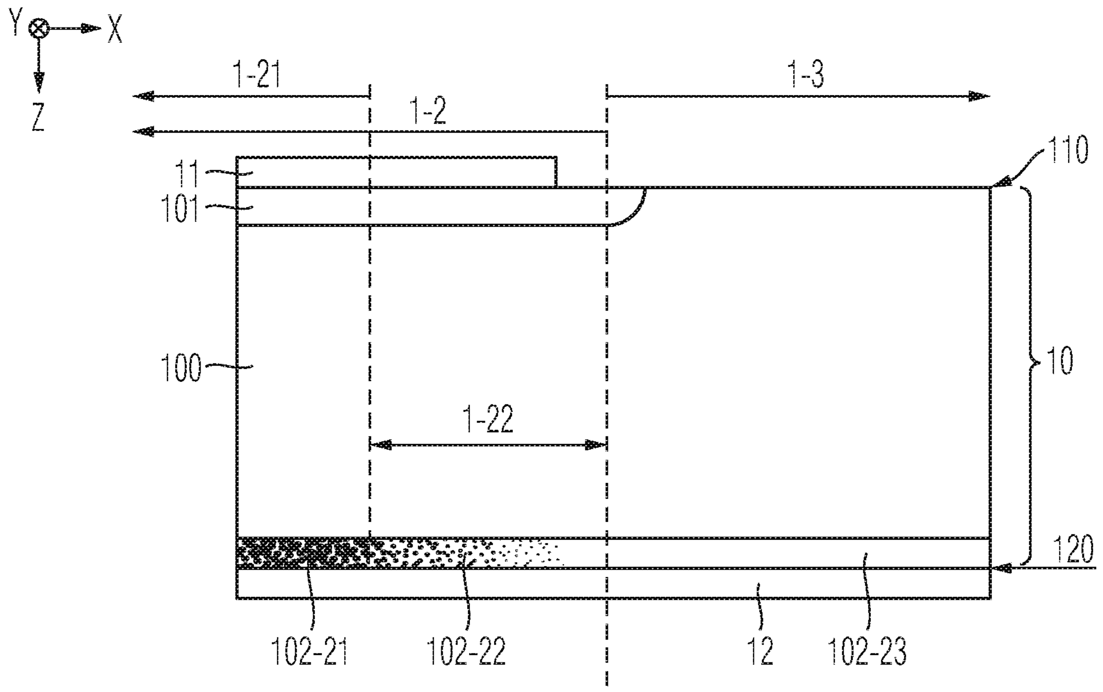

For example, referring to FIGS. 10A and 10B, the aforementioned exemplary variants of the average dopant dose decrease may be achieved by implementing a VLD structure in the peripheral portion 102-22 that provides for a gradual transition, e.g., between a highest average dopant dose of the second doped semiconductor region 102 at a transition between the central volume 1-21 and the peripheral volume 1-22, and the lowest average dopant dose of the second doped semiconductor region 102 at a transition between the peripheral volume 1-22 and the edge termination region 1-3. For example, the VLD structure has a total lateral extension amounting to at least 50% of the total lateral extension of the peripheral volume 1-22. For example, along the entire total lateral extension of the VLD structure, the decrease of the average dopant dose is smaller than, e.g., 5% per 1 μm, or even smaller than 1% per 1 μm.

For example, the VLD structure in the peripheral portion 102-22 has a lateral extension that is defined by the distance between the portion of the second doped semiconductor region 102 that forms a homogenous high-efficiency emitter region in the active region 1-2 (e.g., the central portion 102-21) and the portion of the second doped semiconductor region 102 that forms a homogenous low-efficiency emitter region between the high-efficiency emitter region and the edge 1-4 (e.g., the edge portion 102-23). This lateral extension of the peripheral portion 102-22 can be large compared to a typical diffusion length of the doping (which is of the order of 0.1 to 5 μm) and can amount to at least 10%, to at least 50% or to even at least 100% of the total thickness of the semiconductor body 10 (or the vertical extension of the space charge region at nominal blocking voltage). An exemplary value of the lateral extension of the VLD structure is within the range of 20% to 150% of the thickness of the semiconductor body 10. For example, then there is no point where an abrupt change of emitter efficiency can pin a developing current filament, and the robustness of the power semiconductor device 1 is expected to be limited only by the robustness of the active region 1-2, in accordance with an embodiment.

As explained above and as illustrated in FIG. 10A, the peripheral volume 1-22, and hence, also the peripheral portion 102-22, may extend into both the edge termination region 1-3 and the active region 1-2. For example, the gradual decrease of the average peripheral dopant dose is then implemented across the boundary between the active region 1-2 and the edge termination region 1-3. Alternatively, as illustrated in FIG. 10B, the peripheral volume 1-22 is comprised only the active region 1-2, and the VLD structure may in this case terminate within the peripheral volume 1-22 of the active region 1-2, and the average dopant dose of the second doped semiconductor region 102 may, from the termination of the VLD structure onwards along the lateral direction towards the edge 1-4 be substantially constant, e.g., amounting the average edge dopant dose. For example, in proximity to the transition between the active region 1-2 and the edge termination region 1-3, the dopant dose of the second doped semiconductor region 102 can be substantially equal to the average edge dopant dose.

Figure 11:
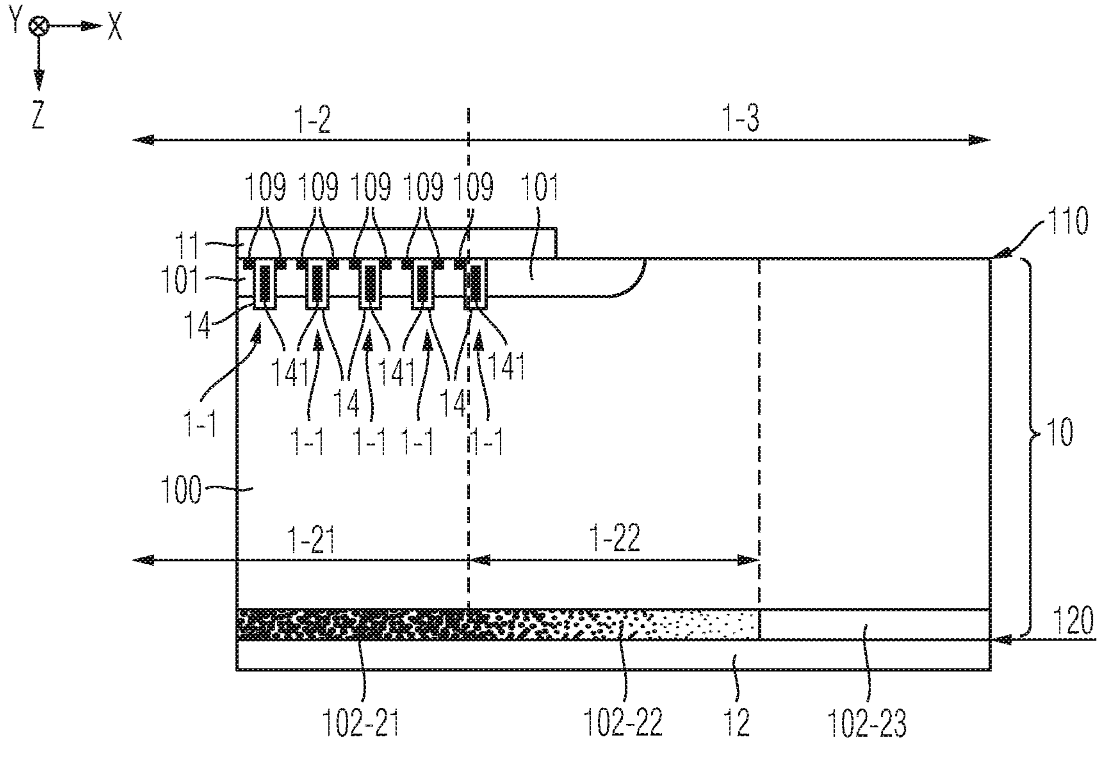

As more clearly illustrated in FIG. 11, the concept of the gradually decreasing average dopant dose in the peripheral portion 102-22 of the second doped semiconductor region 102 may be applied to power semiconductor devices having an IGBT or MOSFET configuration, e.g., with the plurality of power cells 1-1 having a stripe cell or needle cell configuration (cf. FIGS. 2A-B). In case of an IGBT, the second doped semiconductor region 102 is typically of the second conductivity type (e.g., p-doped). At the frontside 110, the first doped semiconductor region 101 can form the p-doped body region of the power cells 1-1. Each power cell 1-1 may further comprise at least one trench 14 with an insulated gate electrode 141 and at least one adjacent semiconductor source region 109 of the first conductivity type. As explained above, the power cells 1-1 are for example only arranged within the active region 1-2.

In accordance with the embodiment illustrated in FIG. 11, the transition between the active region 1-2 and the edge termination region 1-3, i.e., the boundary of the active region 1-2, is at the outermost power cell 1-1, e.g., at the outermost source region 109 that contributes in forming a path for the device load current. Furthermore, the peripheral volume 1-22 is comprised entirely in the edge termination region 1-3.

For example, as illustrated, the power cells 1-1 may laterally overlap with the central portion 102-21 of the second doped semiconductor region 102 which—e.g., in a manner as explained above—differs in the average dopant dose compared to the peripheral portion 102-22 and as compared to the edge portion 102-23 of the second doped semiconductor region 102.

Figure 12:
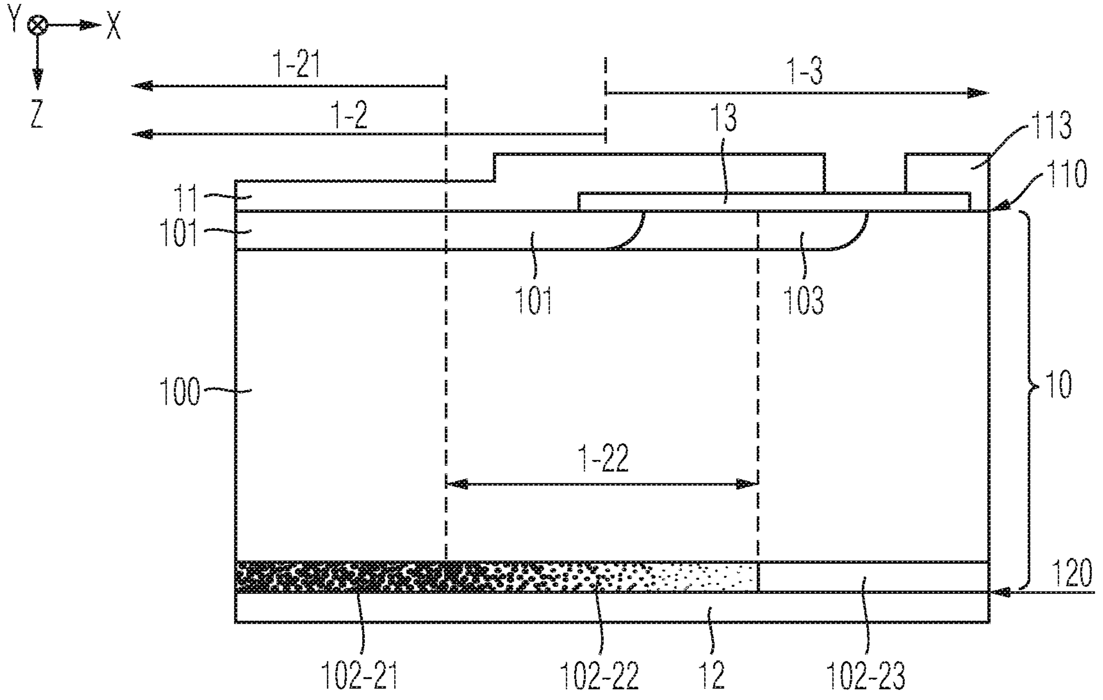
Figure 13:
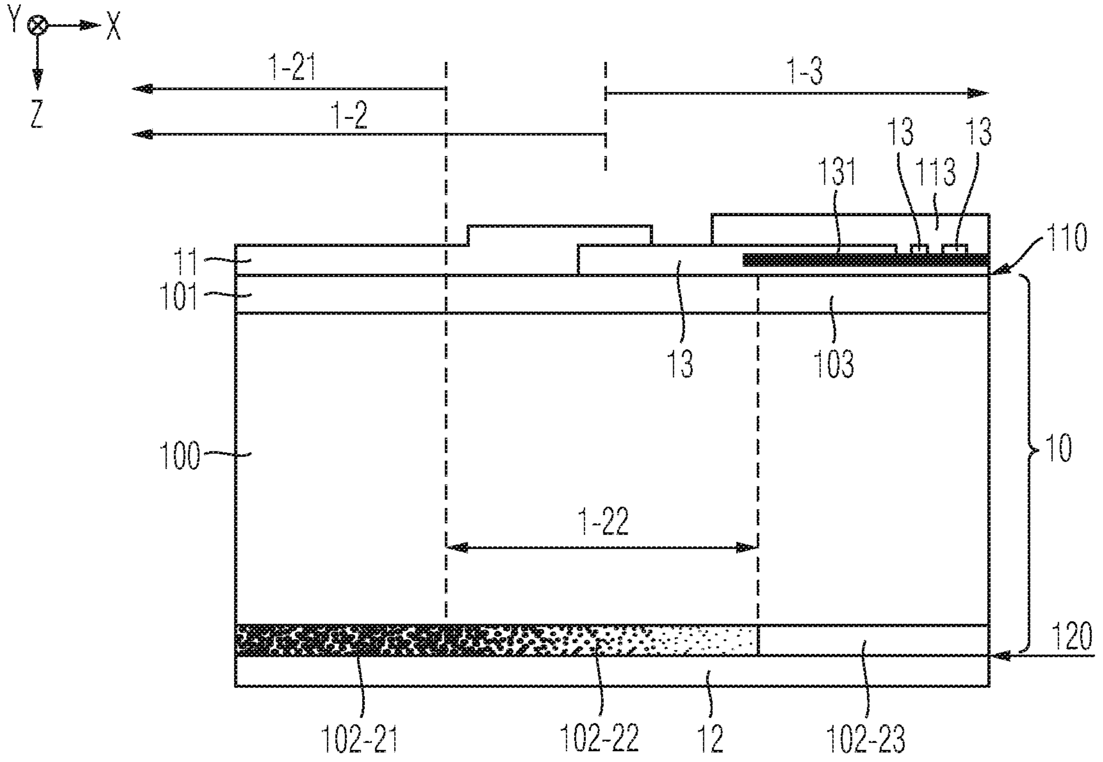

The embodiments illustrated in FIGS. 12 and 13 correspond to the embodiment illustrated in FIG. 10A. In particular, what has been stated there with respect to semiconductor regions/portions 101, 102 may equally apply to the embodiments of FIGS. 12 and 13.

As illustrated in FIGS. 12 and 13, in the edge termination region 1-3, the frontside 110 may comprise the insulation structure 13, e.g., covering the semiconductor body 10 at least partially.

In FIG. 12, an electrically conductive portion 113 exhibiting the electrical potential of the second load terminal 12 may be arranged at the insulation structure 13 and may contact the semiconductor body 10 in the edge termination region 1-3, e.g., in proximity to the edge 1-4, e.g., so as to fulfill a channel stopper functionality.

In a variant according to FIG. 13, the electrically conductive portion 113 exhibits the electrical potential of a control (e.g., gate) terminal (e.g., when the power semiconductor device 1 is an IGBT) and is arranged at the insulation structure 13 and does not contact the semiconductor body 10. Further, for reducing an electrical field strength in the edge termination region 1-3, a field plate 131 may be integrated within the insulation structure 13 and may be electrically contacted by the electrically conductive portion 113. FIG. 13 may also refer to the structure of a gate terminal or a gate finger that is not necessarily located in the vicinity of the chip edge. In this case reference numeral 1-3 could also denote a gate terminal region or a gate finger region.

The third doped semiconductor region 103, which can be of the same conductivity type as the first doped semiconductor region 101 (e.g., both p-doped) and may extend along the frontside 110 within the edge termination region 1-3, and may have the substantially same average dopant dose has the first doped semiconductor region 101, as illustrated in FIG. 13, or may differ in dose, e.g., by exhibiting a lower average dopant dose as the first doped semiconductor region 101 (cf. FIG. 12, indicated by the separating line section between the regions 101 and 103). Furthermore, the third doped semiconductor region 103 may extend throughout the entire lateral extension of the edge termination region 1-3 (cf. FIG. 13) or, respectively, may terminate before the edge 1-4, e.g., so as to avoid being contacted by the electrically conductive portion 113, as illustrated in FIG. 12.

For example, the electrically conductive portion 113 may form a metal pad for a control terminal or a gate finger structure.

Presented herein are also embodiments of a method of processing a power semiconductor device.

For example, in an embodiment, a method of processing a power semiconductor device comprises providing a power semiconductor device having an active region with at least one power cell, wherein the active region has a total volume, the total volume having a central volume forming at least 20% of the total volume; a peripheral volume forming at least 20% of the total volume and surrounding the central volume; and an outermost peripheral volume forming at least 5% of the total volume and surrounding the peripheral volume. The power semiconductor device further comprises an edge termination region surrounding the outermost peripheral volume of the active region, wherein the peripheral volume has a constant lateral distance from the edge termination region; a semiconductor body having a frontside and a backside, wherein the semiconductor body forms both a part of the active region and a part of the edge termination region; a first load terminal at the semiconductor body frontside and a second load terminal at the semiconductor body backside. The method further comprises forming a first doped semiconductor region in the semiconductor body such that it is electrically connected with the first load terminal; forming a second doped semiconductor region in the semiconductor body such that it is electrically connected with the second load terminal. At least one of the first doped semiconductor region and the second doped semiconductor region has a central portion extending into the central volume of the active region and having a central average dopant dose; a peripheral portion extending into the peripheral volume of the active region and having a peripheral average dopant dose, wherein the central average dopant dose is lower than the peripheral average dopant dose by at least 5%, or by at least 10%.

According to another embodiment, a method of processing a power semiconductor device comprises providing a power semiconductor device having an active region with at least one power cell, wherein the active region has a total volume, the total volume having a central volume forming at least 80% of the total volume; a peripheral volume surrounding the central volume; and an edge termination region arranged external of the active region and surrounding the peripheral volume; a semiconductor body having a frontside and a backside, wherein the semiconductor body forms a part of each of the active region, the peripheral volume and the edge termination region. The semiconductor body has a total thickness along a vertical direction between the frontside and the backside. The peripheral volume has a lateral extension amounting to at least half of the total semiconductor body thickness. The power semiconductor device further comprises a first load terminal at the semiconductor body frontside and a second load terminal at the semiconductor body backside. The method further comprises forming a first doped semiconductor region in the semiconductor body such that it is electrically connected with the first load terminal; and forming a second doped semiconductor region in the semiconductor body such that it is electrically connected with the second load terminal. The second doped semiconductor region has a central portion extending into the central volume of the active region and having a central average dopant dose; a peripheral portion extending into the peripheral volume and having a peripheral average dopant dose with, along the lateral extension of the peripheral volume, a negative gradient in a lateral direction towards the edge termination region; and an edge portion extending into the edge termination region and having an edge average dopant dose, wherein the edge average dopant dose is lower than the central average dopant dose.

Exemplary further embodiments of the two methods described in the two preceding paragraphs correspond to the embodiments of the power semiconductor device 1 described above. In so far, it is referred to the aforesaid.

For example, with respect to FIGS. 6A-D, 8A-B, 10A-B and 11-13, various possibilities have been described how the difference in the average dopant doses may be achieved and/or, respectively, how the peripheral average dopant dose may be configured with, along the lateral extension of the peripheral volume 1-22, the negative gradient in a lateral direction towards the edge termination region. For example, one or more additional dopant providing steps (e.g., implantation steps) may be carried out and/or one or more modified masks may be used, e.g., without altering the process flow applied for reference designs, in order to form the first doped semiconductor region 101 and/or the second doped semiconductor region 102 in the peripheral volume 1-22.

For example, in the peripheral volume 1-22, the designated average dopant dose can be accomplished by at least one of a variation of the implantation dose, the implantation duration and a variation of the average percentage of open area along the lateral direction towards the edge 1-4 during implantation.

An example of such modified mask, which may be used, in accordance with an embodiment of the method, for forming the modified first doped semiconductor region 101 has been explained with respect to FIG. 6C; accordingly, a modified mask may be used for forming both the central portion 101-21 and the peripheral portion 101-22 simultaneously, e.g., a mask that exhibits a plurality of openings that increase in at least one of the number and the size along the lateral directions X, Y and R, such that the described difference in the average dopant does may be achieved.

For example, for forming the second doped semiconductor region 102 such that it exhibits the above explained gradual decrease of the average dopant dose in the peripheral volume 1-22, i.e., the negative gradient of the peripheral average dopant dose of the second doped semiconductor region 102 (i.e., in the peripheral portion 102-22) along the lateral direction towards the edge 1-4 that is for example smaller than, e.g., 5% per 1 μm, or even smaller than 1% per 1 μm, an implantation pattern 300 as illustrated in FIG. 15 may be employed, in accordance with an embodiment. There, the non-shaded (white regions) indicate a high implantation dose, whereas the cross-hatched areas indicate a low implantation dose. Hence, in the section of the peripheral volume 1-21 adjacent to the central volume 1-22, the maximal average dopant dose is achieved. Due to the pattern structure, the implantation dose decreases along the first lateral direction X, thereby achieving the above described gradual decrease of the average dopant dose in the peripheral volume 1-22, i.e., providing the gradual decrease by means of the VLD structure in the second doped semiconductor region 102.

Figure 14:
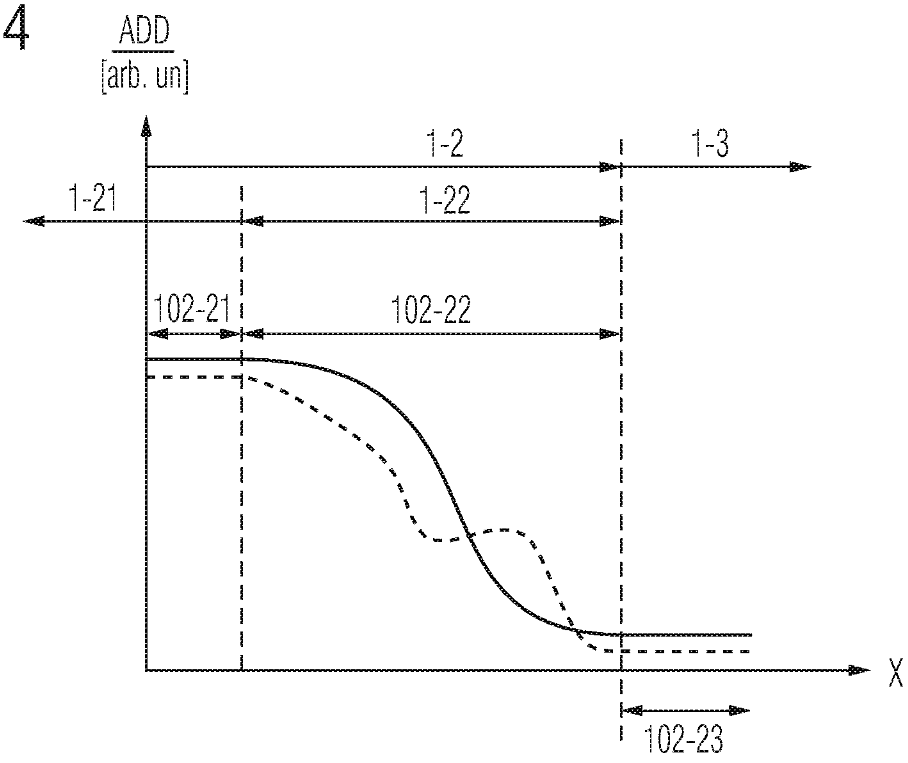

Finally referring to courses of a lateral dopant dose profile schematically and exemplarily illustrated in FIG. 14, the average dopant dose ("ADD") of the peripheral portion 102-22 of the second doped semiconductor region 102 may initially (i.e., in proximity to the transition between the central volume 1-21 and the peripheral volume 1-22) be substantially constant. With the beginning of the VLD structure in the peripheral volume 1-22, the average dopant dose decreases along the first lateral direction X, wherein such decrease may occur gradually (solid line), e.g., substantially linearly, or according to step profile (dotted line). In accordance with the exemplary provisions indicated above, e.g., the decrease of the peripheral average dopant dose of the second doped semiconductor region 102 along the first lateral direction X may for example be below a maximal value; e.g., the negative gradient of the peripheral average dopant dose of the second doped semiconductor region 102 (i.e., in the peripheral portion 102-22) along the lateral direction towards the edge 1-4 is smaller than, e.g., 5% per 1 μm, or even smaller than 1% per 1 μm.

In the above, embodiments pertaining to power semiconductor devices and corresponding processing methods were explained.

For example, these semiconductor devices are based on silicon (Si), Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGalnN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixC1-x) and silicon-SiGe heterojunction semiconductor materials. For power semiconductor switchs applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:

an active region with at least one power cell, wherein the active region has a total volume, the total volume comprising:

a central volume forming at least 20% of the total volume;

a peripheral volume forming at least 20% of the total volume and surrounding the central volume; and an outermost peripheral volume forming at least 5% of the total volume and surrounding the peripheral volume;

an edge termination region surrounding the outermost peripheral volume of the active region, wherein the peripheral volume has a constant lateral distance from the edge termination region;

a semiconductor body having a frontside and a backside, wherein the semiconductor body forms both a part of the active region and a part of the edge termination region; and a first load terminal at the semiconductor body frontside and a second load terminal at the semiconductor body backside, wherein the active region is configured to conduct a load current between the first load terminal and the second load terminal, wherein a load current density in the central volume is lower than a load current density in the peripheral volume by at least 5%.

2. A power semiconductor device, comprising:

an active region with at least one power cell, wherein the active region has a total volume, the total volume comprising:

a central volume forming at least 20% of the total volume;

a peripheral volume forming at least 20% of the total volume and surrounding the central volume; and an outermost peripheral volume forming at least 5% of the total volume and surrounding the peripheral volume;

an edge termination region surrounding the outermost peripheral volume of the active region, wherein the peripheral volume has a constant lateral distance from the edge termination region;

a semiconductor body having a frontside and a backside, wherein the semiconductor body forms a part of the active region and a part of the edge termination region;

a first load terminal at the semiconductor body frontside and a second load terminal at the semiconductor body backside;

a first doped semiconductor region formed in the semiconductor body and electrically connected with the first load terminal; and a second doped semiconductor region formed in the semiconductor body and electrically connected with the second load terminal, wherein at least one of the first doped semiconductor region and the second doped semiconductor region contiguously extends along lateral extensions of the central volume, the peripheral volume, and the outermost peripheral volume, and comprises:

a central portion extending into the central volume of the active region and having a central average dopant dose;

a peripheral portion extending into the peripheral volume of the active region and having a peripheral average dopant dose; and a portion which extends within the outermost peripheral volume, wherein the central average dopant dose is lower than the peripheral average dopant dose by at least 5%.

3. The power semiconductor device of claim 2, wherein the semiconductor body in the active region is configured to conduct a load current between the first load terminal and the second load terminal, and/or wherein the power semiconductor device is a power semiconductor diode, or an IGBT or a MOSFET.

4. The power semiconductor device of claim 2, wherein at least one of the first doped semiconductor region and the second doped semiconductor region contiguously extends along the entire lateral extensions of the central volume, the peripheral volume, and the outermost peripheral volume.

5. The power semiconductor device of claim 2, wherein the portion of the at least one of the first doped semiconductor region and the second doped semiconductor region which extends within the outermost peripheral volume surrounds the peripheral volume.

6. A power semiconductor device, comprising:

an active region with at least one power cell, wherein the active region has a total volume, the total volume comprising:

a central volume forming at least 20% of the total volume;

a peripheral volume forming at least 20% of the total volume and surrounding the central volume; and an outermost peripheral volume forming at least 5% of the total volume and surrounding the peripheral volume;

an edge termination region surrounding the outermost peripheral volume of the active region, wherein the peripheral volume has a constant lateral distance from the edge termination region;

a semiconductor body having a frontside and a backside, wherein the semiconductor body forms a part of the active region and a part of the edge termination region;

a first load terminal at the semiconductor body frontside and a second load terminal at the semiconductor body backside;

a first doped semiconductor region formed in the semiconductor body and electrically connected with the first load terminal;

a second doped semiconductor region formed in the semiconductor body and electrically connected with the second load terminal; and a third doped semiconductor region that seamlessly joins into the first doped semiconductor region in at least the outermost peripheral volume and has a same conductivity type as a conductivity type of the first doped semiconductor region, wherein at least one of the first doped semiconductor region and the second doped semiconductor region comprises:

a central portion extending into the central volume of the active region and having a central average dopant dose; and a peripheral portion extending into the peripheral volume of the active region and having a peripheral average dopant dose, wherein the central average dopant dose is lower than the peripheral average dopant dose by at least 5%.

7. A power semiconductor device, comprising:

an active region with at least one power cell, wherein the active region has a total volume, the total volume comprising:

a central volume forming at least 20% of the total volume;

a peripheral volume forming at least 20% of the total volume and surrounding the central volume; and an outermost peripheral volume forming at least 5% of the total volume and surrounding the peripheral volume;

an edge termination region surrounding the outermost peripheral volume of the active region, wherein the peripheral volume has a constant lateral distance from the edge termination region;

a semiconductor body having a frontside and a backside, wherein the semiconductor body forms a part of the active region and a part of the edge termination region;

a first load terminal at the semiconductor body frontside and a second load terminal at the semiconductor body backside;

a first doped semiconductor region formed in the semiconductor body and electrically connected with the first load terminal; and a second doped semiconductor region formed in the semiconductor body and electrically connected with the second load terminal, wherein at least one of the first doped semiconductor region and the second doped semiconductor region comprises:

a central portion extending into the central volume of the active region and having a central average dopant dose;

a peripheral portion extending into the peripheral volume of the active region and having a peripheral average dopant dose; and a portion which extends within the outermost peripheral volume and surrounds the peripheral volume, wherein the central average dopant dose is lower than the peripheral average dopant dose by at least 5%.

8. A method of processing a power semiconductor device, the method comprising:

providing a power semiconductor device having:

an active region with at least one power cell, wherein the active region has a total volume, the total volume comprising:

a central volume forming at least 20% of the total volume;

a peripheral volume forming at least 20% of the total volume and surrounding the central volume; and an outermost peripheral volume forming at least 5% of the total volume and surrounding the peripheral volume;

an edge termination region surrounding the outermost peripheral volume of the active region, wherein the peripheral volume has a constant lateral distance from the edge termination region;

a semiconductor body having a frontside and a backside, wherein the semiconductor body forms both a part of the active region and a part of the edge termination region;

a first load terminal at the semiconductor body frontside; and a second load terminal at the semiconductor body backside;

forming a first doped semiconductor region in the semiconductor body and electrically connected with the first load terminal; and forming a second doped semiconductor region in the semiconductor body and electrically connected with the second load terminal, wherein at least one of the first doped semiconductor region and the second doped semiconductor region contiguously extends along lateral extensions of the central volume, the peripheral volume, and the outermost peripheral volume, and comprises:

a central portion extending into the central volume of the active region and having a central average dopant dose;

a peripheral portion extending into the peripheral volume of the active region and having a peripheral average dopant dose; and a portion which extends within the outermost peripheral volume, the central average dopant dose being lower than the peripheral average dopant dose by at least 5%.

* * * * *